(12) United States Patent
Nakasuji et al.

(10) Patent No.: US 7,235,799 B2
(45) Date of Patent: Jun. 26, 2007

(54) SYSTEM AND METHOD FOR EVALUATION USING ELECTRON BEAM AND MANUFACTURE OF DEVICES

(75) Inventors: Mamoru Nakasuji, Kanagawa-ken (JP); Tohru Satake, Kanagawa-ken (JP); Takao Kato, Tokyo (JP); Nobuharu Noji, Kanagawa-ken (JP)

(73) Assignee: EBARA Corporation, Tokyo (JP)

(*) Notice: Subject to any disclaimer, the term of this patent is extended or adjusted under 35 U.S.C. 154(b) by 124 days.

(21) Appl. No.: 10/998,160

(22) Filed: Nov. 29, 2004

(65) Prior Publication Data

US 2006/0060790 A1    Mar. 23, 2006

(30) Foreign Application Priority Data

Nov. 28, 2003   (JP)   ............................. 2003-398754
Dec. 8, 2003    (JP)   ............................. 2003-408476

(51) Int. Cl.
*H01J 1/50*        (2006.01)

(52) U.S. Cl. ................. 250/492.23; 250/310; 250/423; 250/396 ML

(58) Field of Classification Search ............ 250/492.23
See application file for complete search history.

(56) References Cited

U.S. PATENT DOCUMENTS 6,750,455 B2 *   6/2004   Lo et al. ..................... 250/346

* cited by examiner

*Primary Examiner*—Nikita Wells
*Assistant Examiner*—Phillip A. Johnston
(74) *Attorney, Agent, or Firm*—Westerman, Hattori, Daniels & Adrian, LLP.

(57) ABSTRACT

An electron beam apparatus having a longer life time of cathode, and allowing a plurality of electron beams to be arranged adequately around an optical axis and five or more electron beams to be formed from a single electron gun. The electron beams emitted from a cathode made of ZrO/W (tungsten zirconium oxide) or a cathode made of carbide of transition metal to the off-optical axis directions may be converged on a sample to scan it. The apparatus includes a plate for reducing a vacuum conductance defined between the electron gun chamber side and the sample side, and apertures are formed through the plate at locations offset from the optical axis allowing for the passage of the electron beams. In order to evaluate a pattern on the sample, the electron beam emitted from the electron gun is incident to the sample surface via an objective lens. The objective lens is composed of a flat electrode having an aperture centered on the optical axis and placed in parallel with the sample surface and an electromagnetic lens including a gap formed in a side facing to the sample. Further, in order to inspect a mask, spacing among a plurality of electron beams after having passed through the mask are extended by a magnifying lens and thus widely spaced electron beams are then converted into optical signal in a scintillator.

4 Claims, 13 Drawing Sheets

SYSTEM AND METHOD FOR EVALUATION USING ELECTRON BEAM AND MANUFACTURE OF DEVICES

BACKGROUND OF THE INVENTION

The present invention relates to an electron beam apparatus, and in particular to an electron beam apparatus for evaluating a substrate (sample) having a minimum line width smaller than 0.1 μm with high throughput. The present invention further relates to an electron beam apparatus allowing a pattern on a wafer to be evaluated with high throughput and also to a pattern to be formed on the wafer with high throughput, even in a case that the wafer has a large diameter equal to or greater than 300 mmϕ. The present invention further relates to a method for manufacturing devices using the same electron beam apparatus.

The present invention relates to a method for evaluating a wafer or a mask having a minimum line width equal to or smaller than 0.1 μm used in manufacturing a semiconductor device with high throughput, and also relates to a method for manufacturing a device using the same method. The present invention also relates to a method for inspecting a mask, specifically a stencil mask (slit transparent mask) or a membrane mask, having a pattern of minimum line width equal to or smaller than 0.1 μm used in manufacturing a semiconductor device with high resolution as well as high throughput, and further relates to a method for manufacturing a device by using the mask inspected by the same inspection method.

Recently, an electron beam has been introduced in the field of evaluation and/or formation of a pattern on a substrate. As for the equipment for emitting the electron beam, there has been known an electron beam apparatus employing an electron gun with a ZrO/W (tungsten zirconium oxide) cathode. In this type of electron beam apparatus, conventionally, a predetermined aperture is formed on an optical axis, through which the electron beam irradiation is directed onto the substrate. In such a case, an exhaust conductance can be reduced by employment of a minute size of aperture to thereby maintain an ultra-high vacuum condition in an electron gun chamber.

There is also a known technology aiming for improving the throughput in the pattern evaluation and/or the pattern forming, which is directed to forming a plurality of electron beams based on the electron beam emitted from the electron gun with the ZrO/W cathode. This technology has suggested a method for forming a total of a maximum of four electron beams from the consideration of the characteristic of the electron gun.

Further, the electron beam with energy as small as 10% of entire energy of the electron beam from the ZrO/W cathode can be made available during actual performance, such as scanning, owing to its inherent property, but the other parts of electron beam are typically left unused. On the other hand, it has been recognized that an electron beam from a cathode of carbide of transition metal, such as TaC, is not emitted in the direction along an optical axis but intensive electron beams are emitted exclusively in the four or eight directions out of the optical axis.

Further, a magnetic lens used in one type of electron beam apparatus that handles a plurality of electron beams has typically employed a magnetic lens with a plurality of optical axes passing through a central region in a plate having a circular outer contour.

In the prior art technology directed to a defect inspection apparatus of image projection type or a method for evaluating a pattern by using a multi-beam, there has been known an apparatus and a method that have employed an electromagnetic lens or an electrostatic lens as an objective lens. Further, a stencil mask inspection apparatus according to the prior art has a structure adapted to scan the back surface of a stencil mask with a single finely focussed electron beam, to detect electrons transmitted through the stencil mask and to thereby form a transmission image of the stencil mask so as to detect a defect in the stencil mask.

SUMMARY OF THE INVENTION

A problem with the prior art is that every one of the above-described electron beam apparatuses suffers from an inherent problem, as will be described below. That is, in the case of a minute-sized aperture having been formed on the optical axis allowing for passage of the electron beam, ions generated in a optical column downstream to the minute-sized aperture could pass through the minute-sized aperture to cause damage to the cathode. This is because the ions having positive charges tend to be accelerated in an electric field produced by the cathode and an anode along the optical axis to impinge upon the cathode, and so the cathode is subject to the ion impingement.

Further, the case of forming a multi-beam from a single beam is also associated with a problem that if only as many as four electron beams can be formed, disadvantageously, the throughput in the pattern evaluation and/or the pattern forming will not be much improved.

Further, as for the ZrO/W cathode, the four electron beams emitted in the directions out of the optical axis, which are comparatively more intensive than the electron beam emitted in the optical axis direction, are unfortunately left unused. On the other hand, as for the TaC cathode, although it can emit intensive electron beams, such intensive electron beams have not been utilized effectively. Yet further, in the attempt to focus the highly intensive electron beams to make them narrower, problematically, the electron beams tend to be blurred from the space charge effect and unsatisfactorily focused.

Further, in use of a magnetic lens having a plurality of optical axes in the central region of the plate defining the circular contour, the optical axes are arranged in a matrix, such as a 3-row×3-column, a 4-row×4-column or even a 5-row×5-column matrix. Owing to this arrangement, there also exists a problem that distances from the coil to respective optical axes are varied, and consequently the lens intensity of the magnetic lens measured for the optical axis in a region proximal to the coil (i.e., the peripheral region) would be slightly different from the lens intensity for the optical axis in a region distant from the coil (i.e., the central region). Another problem is associated with a case where the electron beams arranged in the matrix are used to carry out the pattern evaluation while continuously moving the sample table, as the areas subject to evaluation would be overlapped.

The present invention has been made in the light of the above-described problems of the prior art, and an object thereof is provide an electron beam apparatus allowing a cathode to have an extended life time without the negative effects of the ions generated in the optical column and a plurality of electron beams to be arranged adequately around the optical axis, and in some instances, allowing for a multi-electron beam consisting of five or more electron beams to be formed from a single electron gun. Another object of the present invention is to provide an electron beam apparatus allowing for the four electron beams to reach the sample without deteriorating the intensity of the beams and the electron beams of high current to be narrowed to a small diameter with a maximally suppressed space charge effect.

Yet another object of the present invention is to provide an objective lens adapted to form a plurality of electron beams on a single wafer, which is free from the problem of overlapping of the evaluation areas, and which provides an approximately uniform lens intensity for any one of the electron beams. Another object of the present invention is to provide a method for manufacturing devices using such an electron beam apparatus, or using an electron beam apparatus with such an objective lens as described above.

In a conventional apparatus of image projection type or of multi-beam type employing an electrostatic lens serving as the objective lens, it has been difficult to obtain a high resolution. Further, in a case of employing an electromagnetic lens serving as the objective lens, since the beam is subject to rotation twice in total, one time for the primary beam and another time for the secondary beam, it is difficult to make the rotational position of the beam match the reference coordinate. The present invention has been made also in light of the above circumstances, and an object thereof is to provide a method for evaluation of patterns with an improved beam resolution, yet without causing the problem of misalignment in the rotational position of the beam.

Further, the stencil mask inspection apparatus having the above-described structure according to the prior art has a drawback that the throughput (a volume to be processed in a certain time period) would be remarkably low for the reason that it uses a single finely focused electron beam to scan across the entire surface of the stencil mask. Accordingly, an additional object of the present invention is to overcome the above drawback inherent in the prior art and to provide a method allowing for defect inspection of the masks with high throughput.

To accomplish the above-stated objects, in a first aspect of the present invention, an electron beam apparatus comprises an electron gun for emitting an electron beam from a cathode of ZrO/W or a cathode of carbide of transition metal, and an electron optical system capable of generating a multi-electron beam consisting of five or more electron beams from the electron beam emitted from the electron gun in the off-optical axis direction, and focusing the multi-beam onto a sample so as to scan the sample with the thus focused multi-beam. An electromagnetic lens is disposed between the electron gun and the sample, and is used to adjust the rotation of the electron beam around the optical axis.

In a second aspect of the present invention, an electron beam apparatus comprises an electron gun for emitting an electron beam from a cathode of ZrO/W or a cathode of carbide of transition metal, an electron optical system for converging the electron beam emitted from the electron gun in the off-optical axis direction onto the sample for scanning the same and a shaping aperture plate for forming a multi-electron beam consisting of five to eight electron beams.

In a third aspect of the present invention, an electron beam apparatus comprises an electron gun for emitting an electron beam from a cathode of ZrO/W or a cathode of carbide of transition metal and an electrostatic lens for converting the electron beam emitted from the electron gun in the off-optical axis direction. The electrostatic lens is disposed proximal to the cathode, and is also applied with a positive voltage so as to converge the electron beam onto an NA aperture of an NA aperture plate.

In a fourth aspect of the present invention, said electrostatic lens has a structure in a stack of three electrodes, and an intermediate electrode of said three electrodes has a thickness of 2 mm or greater. In a fifth aspect of the present invention, an aperture formed in the intermediate electrode defines a smaller bore in a side facing to the cathode than a bore in another side facing to the NA aperture plate.

In a sixth aspect of the present invention, an objective lens incorporated in an electron beam apparatus comprises a first and a second part and a coil. The first part comprises a thin plate portion made of ferromagnetic material and having its longitudinal axis in a first direction, and a thick plate portion in a rib structure surrounding circumferentially the thin plate portion, and the first part also includes a plurality of tubular protrusions at locations in the thin plate portion corresponding to optical axes of the electron beams. The second part comprises a thin plate portion made of ferromagnetic material and having its longitudinal axis in the first direction and a thick plate portion in a rib structure surrounding circumferentially the thin plate portion, and a plurality of apertures are formed in the thin plate at locations corresponding to optical axes of the electron beams. The coil is disposed in a space created between respective thick plate portions of the first and the second parts when the first and second parts are combined, together with their portions corresponding to their respective optical axes configured in common, and with a predetermined gap formed therebetween, while the coil is wound in the direction orthogonal to respective optical axes.

In a seventh aspect of the present invention, in said objective lens, a relationship of a distance between the thin plate portions of the first and the second parts with a length of the tubular protrusions along the optical axes is designed such that a lens gap, through which a magnetic flux generated when the current is applied to the coil exits to the outside of the ferromagnetic material, may be formed toward the sample side. In an eighth aspect of the present invention, said objective lens is used to drive the electron beam to perform a scanning operation in a first direction while continuously moving the sample table in a second direction orthogonal to the first direction, to thereby accomplish a pattern evaluation or a pattern drawing of the sample.

In a ninth aspect of the present invention, an objective lens in an electron beam apparatus is operable to focus an electron beam from an electron gun onto a sample. The objective lens has a structure including an exciting coil that is surrounded with an inner magnetic pole in proximity to an optical axis of the electron beam, an outer magnetic pole located at the outer side of the inner magnetic pole, and a magnetic circuit interconnecting the inner magnetic pole with the outer magnetic pole. The lens gap defined between the inner magnetic pole and the outer magnetic pole is open in the side facing to the sample. Each of the inner and the outer magnetic poles has a configuration defining a side wall of a truncated cone tapered gradually from the electron gun side toward the sample side.

In a tenth aspect of the present invention, in said objective lens, an axisymmetric electrode applied with a positive current is disposed between said objective lens and the sample. In an eleventh aspect of the present invention, in said objective lens, a beam separator having at least an electromagnetic deflector or an E×B separator is disposed in the inner side of said inner magnetic pole.

In a twelfth aspect of the present invention, either one of the electron beam apparatuses described above is used to provide evaluation or formation of the patterns. In a thirteenth aspect of the present invention, an electron beam apparatus equipped with the above-described objective lens is used to perform evaluation or formation of the patterns.

A method for evaluating a pattern according to the present invention comprises: a) a step of directing an electron beam emitted from an electron gun onto a sample surface through an objective lens; b) a step of guiding secondary electrons emanating from a sample to a secondary electron detector; c) a step of forming a two-dimensional image with signals from the secondary detector; and d) a step for evaluating the sample based on said two-dimensional image. Said objective lens comprises: a perforated flat electrode positioned in parallel with the sample surface and including an aperture located around an optical axis; and an electromagnetic lens with a gap formed in a side thereof facing to the sample. The electrode is not necessarily circularin outer contour, if it is located sufficiently distant from the optical axis, so long as the apertures are arranged to be axisymmetric.

In a method for evaluating a pattern according to the present invention, preferably a rotational position of the primary electron beam or the secondary electrons around the optical axis is controlled by altering the exciting current to said electromagnetic lens, and a resultant misalignment in focal condition is corrected by adjusting a voltage between said flat electrode and the sample. Further, said primary electron beam is formed to be rectangular in its section view. Said rotational position is defined by an angle formed between a side of said rectangular beam and an edge of the pattern on the sample or a reference coordinate axis.

An electron beam apparatus of the present invention is operable to scan a sample with a plurality of electron beams. The plurality of electron beams are arranged such that their irradiation points on the sample define an m-row×n-column array, in which the orientation of said m-row and the orientation of said n-column are orthogonal to each other, and also each of the orientations is defined to form a predetermined inclination angle relative to the scanning direction of the electron beams, said predetermined inclination angle having been selected such that the irradiation points projected on an axial line orthogonal to said scanning direction may be equally spaced.

Further, said primary electron beam is formed into a multi-beam. Said rotational position is represented by the directions, D1 and D2, in conformity to the orientations of beams of the multi-beam relative to the reference coordinate axis and selected such that the even raster spacing is obtained upon scanning with the multi-beam. The present invention further provides a method for manufacturing a device characterized in using said method for evaluating the pattern to evaluate the wafer in the course of wafer processing.

A method for inspecting a mask according to the present invention, comprises: a) a step of scanning one surface of a mask with a finely focused plurality of electron beams based on a scanning signal; b) a step of extending spacing among the plurality of electron beams transmitted through the mask by a magnification lens; c) a step of converting thus widely spaced electron beams into an electric signal; d) a step of forming a two-dimensional image based on said scanning signal and said electric signal; e) a step of converting design data of the mask to data for inspection; and f) a step of comparing said data for inspection with said two-dimensional image to provide a defect inspection of the mask.

In the method for inspecting a mask according to the present invention, preferably said plurality of electron beams is focused finely by a magnetic lens having a gap in its side facing to the mask. Further, the plurality of electron beams is formed by irradiating an electron beam generated by an electron gun of thermionic emission type onto a plurality of apertures, said electron gun being operated under the space charge limited condition. Said finely focused plurality of electron beams is formed into a contracted image of a plurality of apertures by irradiating an electron beam obtained through the thermal field emission induced in a Schottky cathode of ZrO/W (tungsten zirconium oxide) or a carbide cathode of transition metal onto said plurality of apertures. The present invention further provides a method for manufacturing a device characterized in using a mask that has been inspected in accordance with a method described above.

A method for evaluating a sample by irradiating a plurality of electron beams onto a sample according to the present invention comprises: a) a step of forming a plurality of electron beams arranged substantially into an orthogonal array of m-row×n-column; b) a step of raster scanning with said electron beam in the array of m-row by n-column in one axial direction; c) a step of adjusting an angle formed between an orientation of the array of the electron beams and a direction of raster scanning so that the raster spacing between any adjacent electron beams is equally spaced; d) a step of detecting secondary electrons emanating from irradiation points on the sample by said electron beams in the array of m-row×n-column to obtain a signal of m×n channels, and e) a step of evaluating the sample by using said signal of m×n channels.

An electron beam apparatus of the present invention, owing to its configuration including no aperture on the optical axis between the electron gun chamber and the optical column, can advantageously reduce the possibility that the ions from the optical column would impinge upon and cause damage to the cathode. Further, the present invention employs the two-stage of electromagnetic lenses disposed between the aperture plate having four apertures and the sample, allowing for a shorter focal length in those electromagnetic lenses with the resultant optical path length between the aperture plate and the sample successfully being reduced to 30 cm or shorter. Another advantage will be brought about in conjunction with this, that the space charge effect can be reduced and thus the electron beam having a higher current can be formed in a smaller size. Further advantageously, since a number of electron beams are formed, the throughput in evaluation or forming of the patterns on the sample can be improved.

The present invention can provide a method for evaluating the pattern with higher beam resolution which is free from the problem of the misalignment of rotational position. The present invention overcomes the drawbacks associated with the prior art, and it can provide a method allowing for defect inspection of the mask with high throughput. According to the present invention, defect inspection of the mask can be achieved with high resolution. In the method for inspection of the present invention, since the LaB6 cathode is used in the space charge limited condition, the S/N ratio can be improved by four times as compared to that of the Schottky cathode, meaning that the same S/N ratio can be obtained with a beam current as low as 1/16. From the consideration of the availability of eleven to twenty-two beams, a throughput ten times as high as that of the prior art, or even higher, can be expected.

BRIEF DESCRIPTION OF THE DRAWINGS

FIG. 5 shows an objective lens according to a third embodiment of the present invention, wherein FIG. 5(A) shows a plan view and FIG. 5(B) shows a sectional view;

FIG. 6 shows a variation of the objective lens according to a third embodiment of the present invention, wherein FIG. 6(A) shows a plan view and FIG. 6(B) shows a sectional view;

EXPLANATION OF REFERENCE SIGNS

Figure 1:
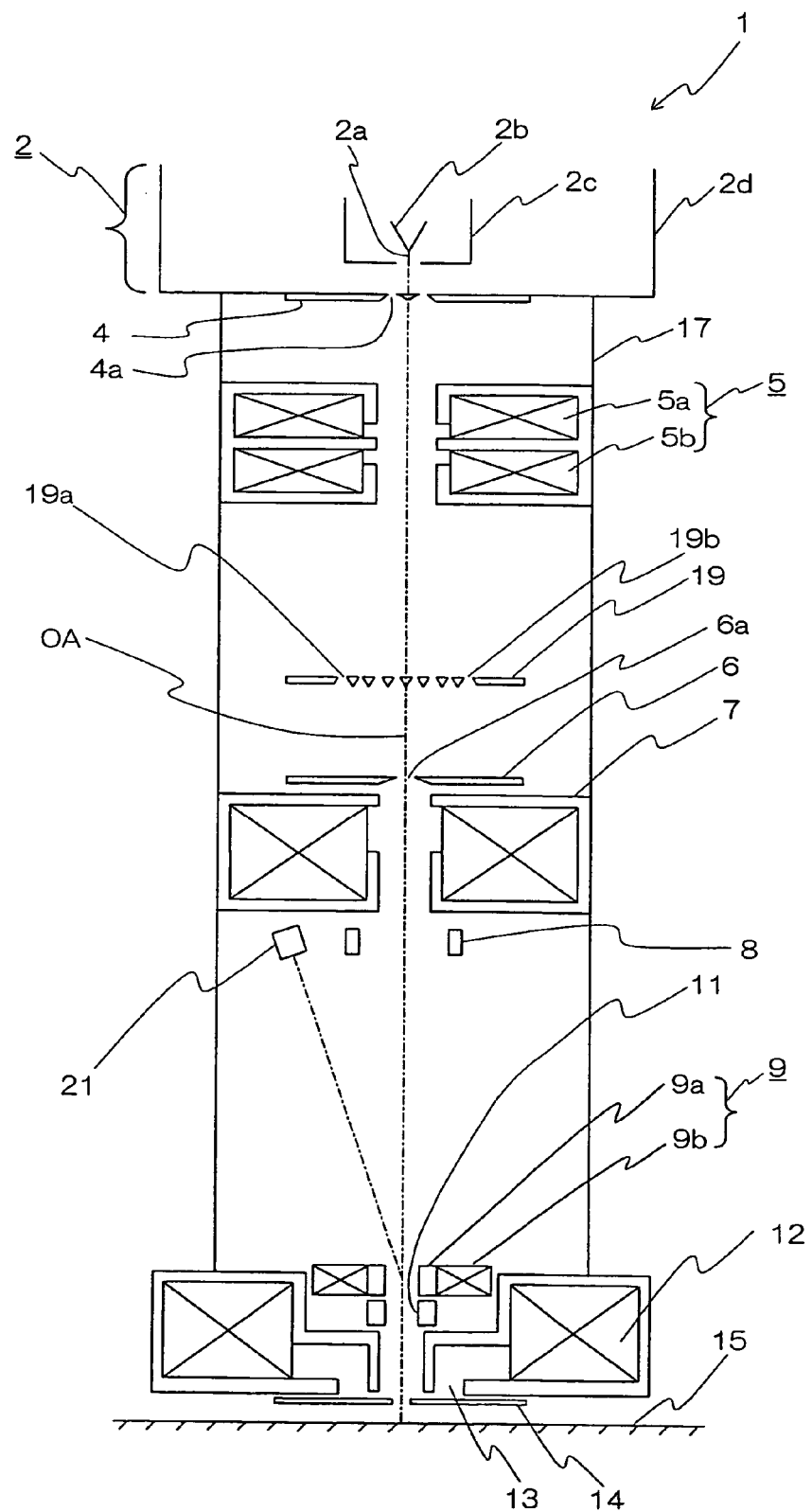
FIG. 1 is a schematic diagram showing an electron beam apparatus according to a first embodiment of the present invention.

1: electron beam apparatus, 2: Electron gun, 2a: Cathode, 2d: Electron gun chamber, 4: Anode, 5: Rotation control lens, 6: NA aperture plate, 6a: NA aperture, 7: Reducing lens, 9: ExB separator, 12: Magnetic lens (Objective lens), 13: Lens gap, 14: Axisymmetric electrodes, 15: Sample, 19: Shaping plate, and 19a, 19b: Beam shaping aperture.

20: Area with an electron beam intensity equal to or greater than a predetermined value, 31: Area subject to an electron beam emitted from the (310) orientation, with an intensity equal to or greater than 60%, and 32: Area subject to an electron beam emitted from the (100) orientation, with an intensity equal to or greater than 60%.

51: Electron beam apparatus, 52: Electron gun, 52a: Cathode, 52b: Heater, 55a: Leading electrode, 55b: Central electrode, 55c: Anode electrode, 57: Beam shaping aperture plate, 57a: Beam shaping aperture, 58: NA aperture plate, 58a: NA aperture, 59: Reducing lens, 61: ExB separator, 62: Electromagnetic lens serving as an objective lens, 63: Electrode, 65: Sample, 66, 68: Electrostatic lens, and 67, 69: Deflector.

70: Aperture plate, 71: Secondary electron detector, 72: A/D converter, 73: Image forming circuit, 75: Image memory, and 76: Comparison circuit.

101: Objective lens, 102: Electron beam transmission bore, 103: Protrusion, 104: Lens gap, 105: Aperture interior wall surface, 106: Thin plate, 107, 108: Thin plate portion, 109, 111: Thick plate portion, 110: Coil, 112: Sample, 113: O-ring retainer member, and 114: O-ring.

151: Objective lens, 160: Coil, 171, 180, 181: Deflector, 172, 176, 179: Aperture, 173, 174: Thin plate portion, 175: Lens focal length correcting electrode, 177, 178: Thick plate portion, 182: X-axial deflection coil, and 183: Y-axial deflection coil.

201: Objective lens, 203: Inner magnetic pole, 204: Outer magnetic pole, 205: Spacer, 206: Lens gap, 207, 208, 209: Hatching portion, 210: Exciting coil, 211: Magnetic circuit, 212: ExB separator, 215: Electrode, and OA: Optical axis.

301: Cathode, 333: Anode, 348: Condenser lens, 305: Multi-aperture plate, 305a: Multi-aperture, 306: NA aperture, 307: Reducing lens, 308: Axial aligning and scanning deflector (First scanning deflector), 342: Second scanning deflector, 310: Electromagnetic lens serving as an objective lens, 310c: Axisymmetric electrode, 310b: Lens gap, and 310d: Lens power supply.

311: Gap, 312: Mask to be inspected (Stencil mask, Membrane mask), 313: First magnification lens, 314: Second magnification lens, 315: Detector (Scintillator+PMT detector), 316: Signal processing circuit, 317: Image forming circuit, 318: Comparator, 319: Pattern data, 320: Data converter, 321: Defect output device, 322: Scanning power supply, 323: Deflector, and 325: Deflector.

333: First anode, 334: Second anode, 335: Third anode, 340, 341, 346, 347: Axial aligning coil, 342: Scanning deflector and axial aligning deflector, 348: Condenser lens, 352: Wehnelt, 365: Electrostatic deflector for ExB, 366: Electromagnetic deflector for ExB, 368: Negative power supply, 369: Positive power supply, 371: Magnification lens, 372: Second magnification lens, 373: Secondary electron detector, 374: Signal processor, and 375 Pattern memory.

430: Electron beam apparatus, 431: Electron gun, 432: Condenser lens, 433: Field aperture, 434: NA aperture, 435: Irradiation lens, 436: Octopole-deflector for ExB, 437: Deflection coil for ExB, 438: Second objective lens, 439: First objective lens, 440: Lens gap, 441: Axisymmetric electrode, 443: Magnification lens, 444; Magnification lens, 445: FOP window with a scintillator, 446: Optical lens, 447: TDI camera, and 448: Conjugate plane of a sample relative to a primary beam.

D1, D2: Orientation of alignment, K: Sample (Wafer), and Ka: Sample surface.

DETAILED DESCRIPTION OF THE INVENTION

Referring first to FIG. 1, a configuration of an electron beam apparatus 1 according to a first embodiment of the present invention will be described in a sequential manner from the upstream to the downstream along an optical axis OA. FIG. 1 is a schematic diagram generally showing the electron beam apparatus 1. The electron beam apparatus 1 is equipped with an electron gun 2 comprising a ZrO/W cathode 2a for emitting an electron beam and a cathode heating filament 2b for heating the ZrO/W cathode 2a. The ZrO/W cathode 2a and the cathode heating filament 2b are enclosed with a Schottky shield 2c. The Schottky shield 2c is provided for the purpose of turning back thermions from the cathode heating filament 2b to thereby protect the electron beam from the negative effect otherwise caused thereby. The Schottky shield 2c includes a specified aperture formed adjacent to the ZrO/W cathode 2a, allowing for the passage of the electron beam therethrough. It is to be noted that the cathode may be made from carbide of transition metal, as will be described later in more detail.

The Schottky shield 2c is also enclosed with an electron gun chamber 2d, and a flat plate-like anode 4 serving also as an orifice is disposed on an exterior wall of the electron gun chamber 2d at a location corresponding to the optical axis OA. This anode 4 includes four minute apertures 4a (only two of them illustrated in FIG. 1) arranged at locations slightly offset from the optical axis OA. In this regard, the minute apertures 4a defining remarkably small apertures can provide a partition between a space in the electron gun chamber 2d side and a space of a optical column 17 in the sample 15 side so as to allow vacuum conductance to be kept low. In conjunction with this, the anode 4 is designed to provide an adequate position and geometry of each of the four minute apertures 4a so that the portions of electron beam with high intensity, among the electron beams emitted in the off-optical axis directions offset from the optical axis OA, can pass through each of the apertures.

A rotation control lens 5 is disposed at a location downstream with respect to the anode 4. The rotation control lens 5 has a two-step structure along the optical axis OA, with respective steps wound by respective coils 5a and 5b. Respective coils 5a and 5b are controlled to make their current flow in the opposite directions to each other so that the directions of produced magnetic fields are opposite to each other. The rotation control lens 5 of the two-step structure is designed with bore diameters and also magnetic gaps in respective steps equally sized, so that when equivalent currents are flowing in respective coils 5a, 5b, the rotation of the electron beam around the optical axis can be cancelled. On the other hand, the rotation amount of the electron beam in a clockwise or a counter-clockwise direction around the optical axis OA can be increased or decreased by altering a ratio of current flowing in the coil 5a to that in the coil 5b.

Figure 2:
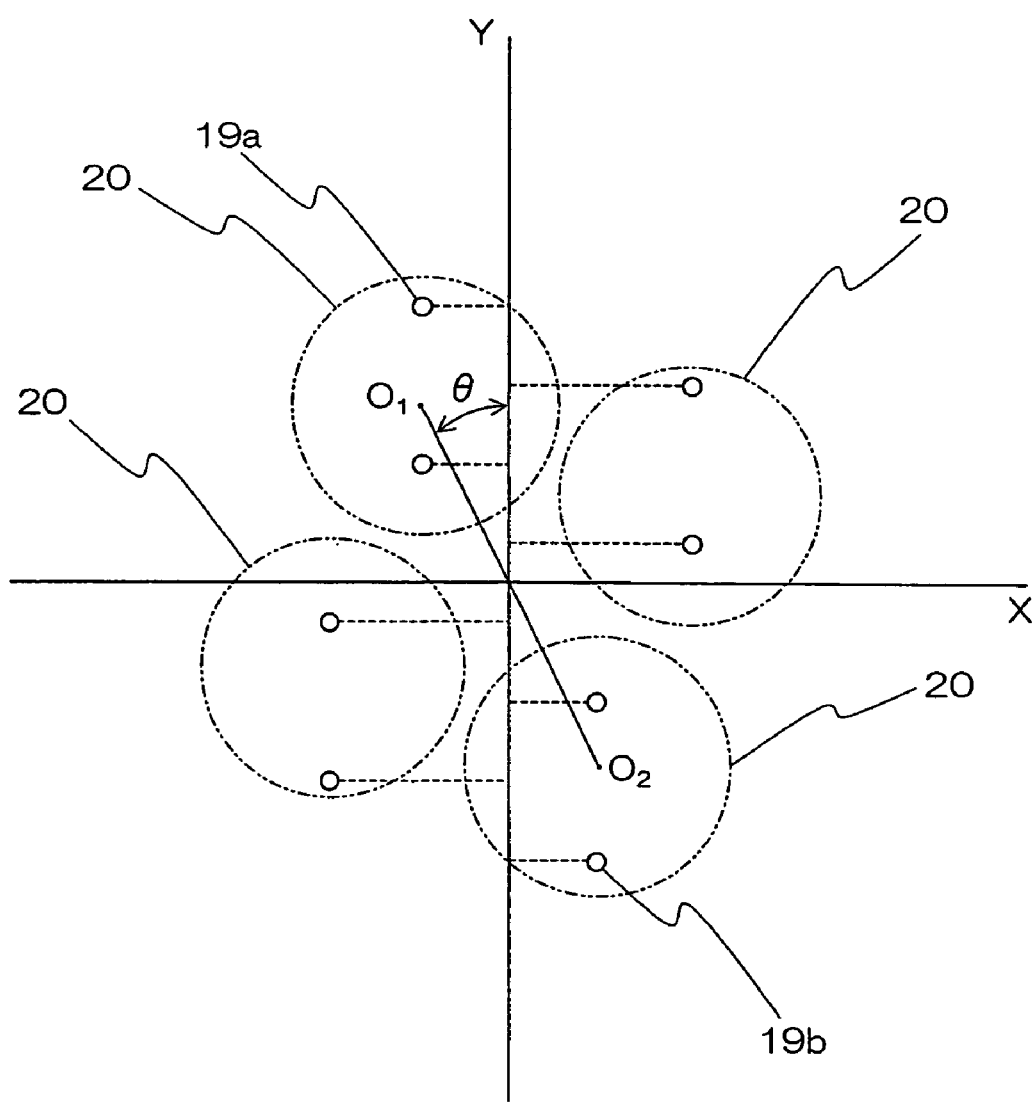
FIG. 2 is a plan view illustrating a beam shaping aperture as disclosed in FIG. 1 and an electron beam irradiation area.

More specifically, it is assumed that under the condition of substantially no rotational effect from the rotation control lens 5 working, for example, a line connecting relatively intensive center points of two electron beams resides on the Y-axis. Under this condition, when respective coils 5a, 5b are applied with the current at a specified ratio of one to the other, owing to the rotational effect from the rotation control lens, a specified angle, θ, is formed between the line connecting the intensive center points O1 and O2 of the electron beams and the Y-axis. FIG. 2 shows, by way of example, a case where an original point is in the position of optical axis and respective electron beams form the rotational angles, θ, around the optical axis. It is to be noted that the purpose of controlling the rotational angle of the electron beams around the optical axis is to align the specific portion of maximum intensity of the electron beam with the position of beam shaping aperture precisely, as will be described later. Further, it is to be noted that the rotation control lens also has a function for converging the electron beams in addition to the above-discussed rotational function.

Further, a shaping plate 19 for shaping the electron beam is disposed in a location downstream with respect to the rotation control lens 5. This shaping plate 19 includes a number of beam shaping apertures (eight in FIGS. 1 and 2), with the beam shaping apertures 19a and 19b defined at opposite ends in the Y-axis direction. Respective beam shaping apertures are arranged so that spacing between the electron beams projected on the Y-axis are all equal, and also every one of the beam shaping apertures is within an area 20 defined by the intensity of 60–80% of the irradiation electron beam emitted through the anode 4. For the purpose of this application, the term "electron beam intensity of 80%" means that a specific intensity measured relative to 100% intensity is 80% under the assumption that the intensity at a location within the region 20 having the highest beam intensity (typically the center thereof) is taken as 100%.

An NA aperture plate 6 having an NA aperture 6a is disposed at a location downstream with respect to the shaping plate 19, and a reducing lens 7 is disposed at a location further downstream with respect to the NA aperture plate 6. Electrostatic deflectors 8, 11 are disposed at respective locations further downstream with respect to the Reducing lens 7, which are operable to deflect the electron beam. Further, a magnetic lens 12 is disposed below the electrostatic deflector 8. The sample 15 is placed at a furthest downstream location along the optical axis OA, where a surface of the sample is exposed to the irradiation of the electron beam.

Further, an axisymmetric electrode 14 is disposed in the vicinity of the surface of the sample 15, which is applied with a positive voltage for accelerating secondary electrons emanating from the sample 15. In addition, a magnetic lens 12 and a system of E×B separator 9 (comprising an electrostatic deflector 9a and an electromagnetic deflector 9b) are disposed in the returning path of the electrons from the axisymmetric electrode 14 along the optical axis OA toward the upstream side. Further, a secondary electron detector 21 is disposed in the direction of the electron beam deflected by the E×B separator 9.

An operation of the above-described electron beam apparatus 1 will now be described. A part of the electron beam emitted from the ZrO/W cathode 2a is advanced toward the anode 4. Then, it passes through the four minute apertures 4a at locations slightly offset from the optical axis OA. Ions produced at this time in the optical column portion are accelerated by an electric field generated by the cathode 2a and the anode 4 toward the cathode side, but owing to the positions of the minute apertures 4a offset from the optical axis, the direct impinging of the ions upon the cathode 2a can be avoided. The four electron beams that have passed through the minute apertures 4a of the anode 4 are converged and rotated around the optical axis OA by the rotation control lens 5, and then pass through the beam shaping aperture of the shaping plate 19. The eight beam shaping apertures including beam shaping apertures 19a, 19b located in opposite ends of the shaping plate 19 are designed such that they are all equally spaced when projected on the Y-axis, as explained above (see FIG. 2). This can help prevent the scanning areas from being overlapped during scanning with the beams.

The electron beams that have been shaped in the beam shaping aperture form a crossover in the NA aperture 6a of the NA aperture plate 6. Then, the electron beams that have passed through the NA aperture are reduced by the reducing lens 7 and the magnetic lens (objective lens) 12, so that the surface of the sample 15 is irradiated with eight of the electron beams. In this stage, the electron beams are being driven to make a scanning operation in the X-axis direction by means of the electrostatic deflectors 8 and 11. The secondary electrons emanating from the scanning points on the sample 15 are accelerated by the positive axisymmetric electrode 14, converged by the magnetic lens 12 and then deflected toward the secondary electron detector 21 by the E×B separator 9. An SEM (scanning electron microscope) image by eight channels can be obtained through the detection of the secondary electrons by the secondary electron detector 21.

Figure 3:
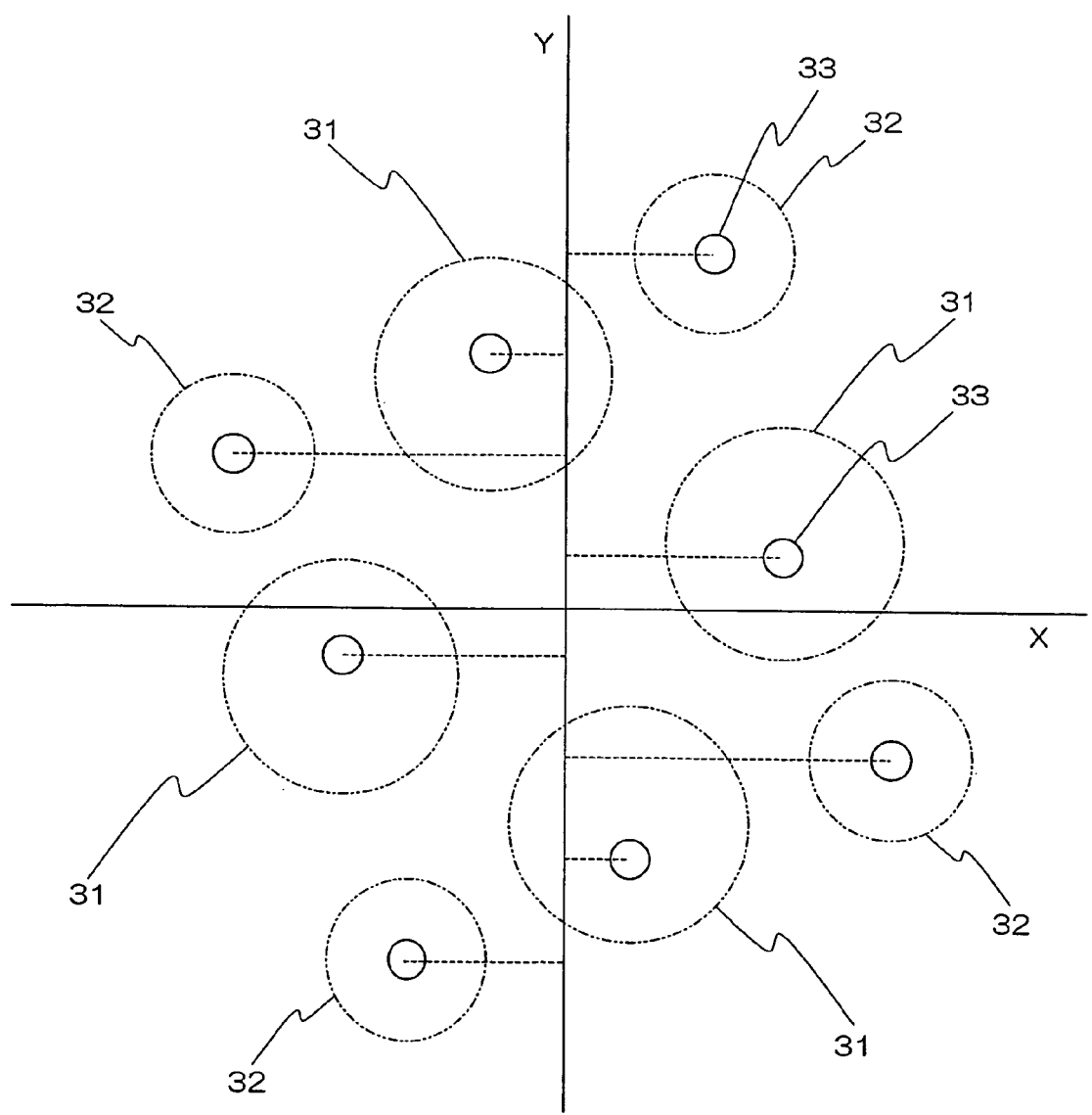
FIG. 3 is a plan view illustrating a beam shaping aperture and an electron beam irradiation area for an electron gun that has employed a cathode of carbide of transition metal.

FIG. 3 is a diagram showing the intensity distribution in the directions of the electron beam emission when the TaC cathode (cathode made from carbide of transition metal) with the optical axis direction set in the (100) orientation is employed as the electron gun. The area 31 in the diagram represents the region of the electron beam emitted from the (310) orientation, and similarly the area 32 from the (100) orientation, respectively, with the intensity of electron beams equal to or higher than 60%. From the consideration that the intensity of the electron beam emitted from the (100) orientation is relatively low, and thus the area having the intensity equal to or higher than 60% is small, the beam shaping apertures 33 have been designed in the shaping plate, respectively, so that the electron beam in its center portion can be utilized. On the other hand, as for the area of the electron beam from the (310) orientation having the high intensity and thus the larger area with the intensity of 60% or greater, a sufficiently intensive electron beam can be obtained even in an off-center location in the area. Accordingly, the beam shaping apertures 33 can be arranged in positions allowing for even spacing among the eight electron beams projected on the Y-axis.

Figure 4:
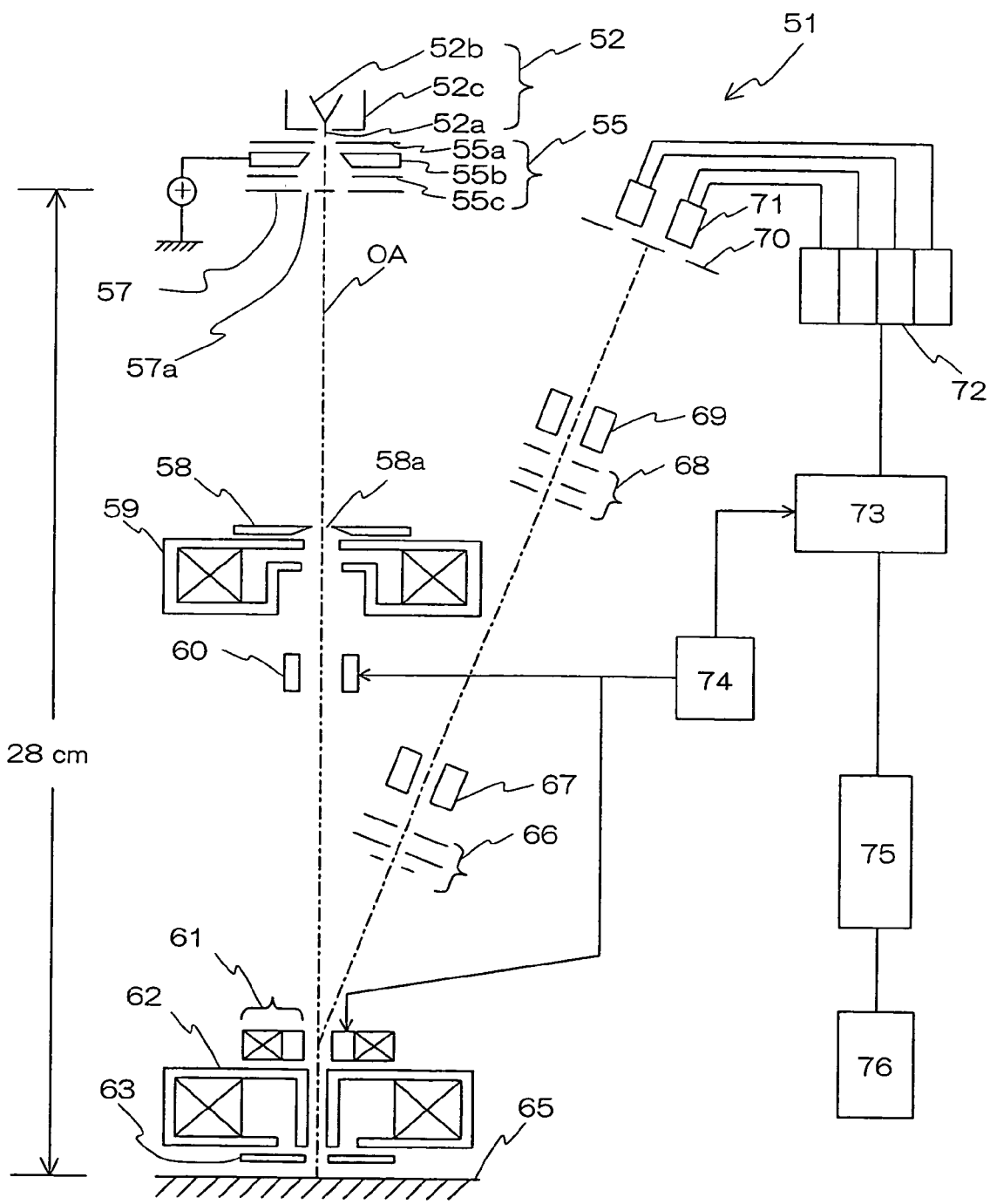
FIG. 4 is a schematic diagram of an electron beam apparatus according to a second embodiment of the present invention.

A second embodiment of the present invention will now be described with reference to FIG. 4. FIG. 4 shows an entire configuration of an electron beam apparatus 51 according to the second embodiment. The electron beam apparatus 51 is provided with an electron gun 52. This electron gun 52 is commercially available and includes a ZrO/W cathode 52a welded to a heater 52b and aligned with an aperture of a Schottky shield 52c. Further, a leading electrode 55a is disposed in a location downstream with respect to the electron gun 52. Although the leading electrode 55a according to the prior art has employed a hole of 0.6 mm formed therein, the present invention uses a hole in a range of 0.8 to 1.2 mm$\phi$, which is greater than that in the prior art, so that the electron beam emitted in the off-optical axis direction will not be blocked by the leading electrode 55a.

Further, a central electrode 55b and an anode electrode 55c are disposed at respective locations downstream with respect to the leading electrode 55a, and these three electrodes constitute an electrostatic lens system 55. In this configuration, the electrostatic lens system 55 controls a focal distance such that the electron beam emitted off the optical axis can form a crossover in an NA aperture 58a of an NA aperture plate 58. Further, the electrostatic lens 55 is applied with a positive voltage at the central electrode 55b therein so as to serve as an accelerating lens in order to converge the electron beam emitted at a large angle with respect to the optical axis OA with reduced aberration. Further, in order to obtain required convergent power with low voltage to avoid any discharge, the central electrode 55a is as thick as 3 mm or more along the optical axis. In this regard, a simulation has proved that the thickness of 2 mm or more can work effectively to provide a satisfied convergence of the electron beam. It has been further acknowledged that the positive voltage to be applied can reduce the aberration more efficiently as compared to the negative voltage.

The aperture is formed in said central electrode 55b for permitting the passage of the electron beam therethrough, and the aperture of the central electrode 55b has a smaller bore defined in the ZrO/W cathode 52a side and a larger bore defined in the NA aperture plate 58 side in order to form the crossover with reduced spherical aberration in the NA aperture 58a. In this regard, it has been also found that the smaller aberration may be accomplished when the central electrode 55b is grounded and the aperture bore of the central electrode 55b defined in the electron gun 52 side is almost the same as the bore of the leading electrode 55a. The reason the aberration is smaller is that the electrode can be made smaller at a location where the loci of the electrons are converged by the lens to pass through an area close to the optical axis, and so the loci are not so close to the electrode.

Further, a beam shaping aperture plate 57 having four beam shaping apertures 57a (only two of them illustrated in FIG. 4), is disposed at a location immediately downstream with respect to the electrostatic lens system 55. Each of the beam shaping apertures 57a has a diameter of 50 µm so as to provide a small vacuum conductance and thus to take an additional role of orifice.

The electron beam that has passed through the four beam shaping apertures 57a is reduced by a reducing lens 59, then further reduced by an electromagnetic lens 62 serving as an objective lens ultimately to the size of about ½000 on the sample 65. The surface of the sample 65 is applied with the two-dimensional raster-scanning by a deflector 60 and an electrostatic deflector of an E×B separator 61, and resultantly an SEM image is formed. In this stage, the scanning operation of the electron beam is carried out in accordance with an instruction from a scanning control section 74. Then, secondary electrons emanating from the four scanning points on the sample 65 are focused narrower with the aid of an electrode 63 applied with a positive voltage and the electromagnetic lens 62 serving as the objective lens. The thus converged beam of the secondary electrons forms a magnified image at a location adjacent to the E×B separator 61 and then is magnified further by electrostatic lenses 66 and 68 into an image of the sample 65 over an aperture plate 70 having four apertures. In this stage, the secondary electrons are deflected by aligning deflectors 67, 69 in synchronization with the scanning operation.

Further, the system comprises a secondary electron detector 71 located behind the aperture plate 70, which is provided in the form of combination of a scintillator with a photo multiplier and where a secondary electron signal from the four electron beams are detected and amplified independently. The amplified signal of the secondary electrons is converted into a digital signal in an A/D converter 72 and sent to an image forming circuit 73. Scanning signals from a scanning control section 74 are also input to the image forming circuit 73, where a two-dimensional image is formed. The thus formed two-dimensional image is stored in an image memory 75, while a comparison circuit 76 carries out a cell-to-cell or die-to-die comparison to perform a defect inspection or the like for a pattern on the sample 65.

The present invention has successfully achieved the distance between the beam shaping aperture plate 57 and the sample 65 to be as short as 28 cm, that is less than the value of 30 cm, by means of the lenses of short focal length employed for the reducing lens 59 and the magnetic lens 62 serving as the objective lens. With this achievement, the present invention can suppress the space charge effect. Further, owing to the arrangement of the electrostatic lens 55 closer to the electron gun 52, the four electron beams emitted off the optical axis OA can be converged before their departing far away from the optical axis OA, and thus the crossover with reduced aberration can be formed in the NA aperture 58a, thereby allowing for highly intensified four electron beams to be obtained.

Further, owing to the construction of the objective lens, which has been implemented in the combination of the electromagnetic lens 62 serving as the objective lens and the electrode 63 applied with the positive voltage, the present invention has successfully reduced the aberration of the primary electron beam and thus allows for the electron beam current of 29 nA with the beam diameter of 25 nm$\phi$ to be obtained. Further, since the present invention has achieved the reduced aberration for the first step of magnification lens through which the secondary electrons are transmitted, the secondary electrons emanating from the sample at the angle of ±90° or in every direction above the sample can be collected into the detector 71 for secondary electrons without any cross-talks therebetween.

Figure 5:
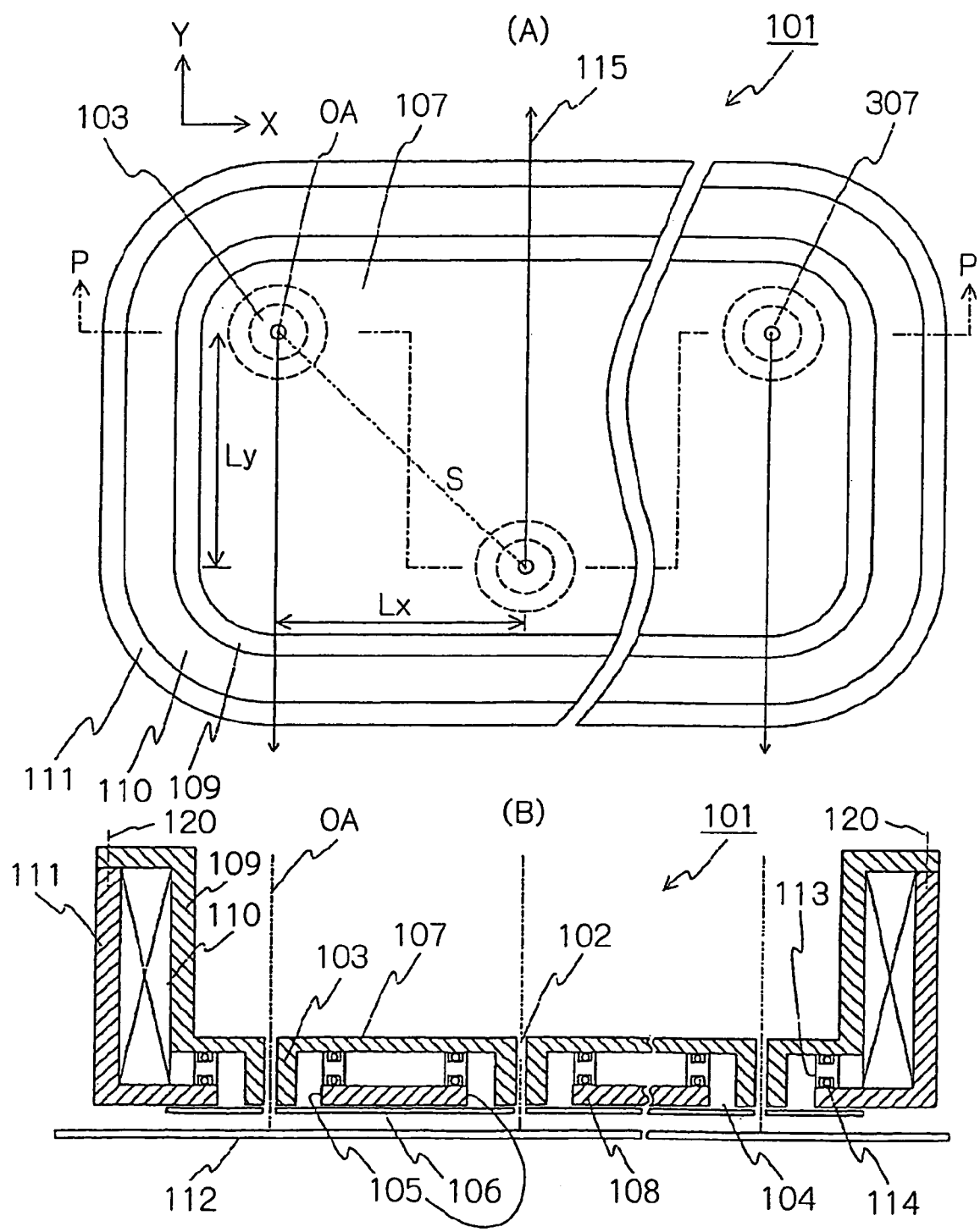

A third embodiment of the present invention will now be described with reference to FIG. 5. FIG. 5 shows an objective lens 101 used in an electron beam apparatus, where FIG. 5(A) is a plan view and FIG. 5(B) is a sectional view taken along the section line P—P of FIG. 5(A). This objective lens 101 is intended to provide an evaluation of patterns on a sample 112 by moving a sample table (omitted in the drawing) continuously in the Y-axis direction (the second direction) and comprises rectangular thin plate portions 107, 108 having their longitudinal axes along the X-axis direction (the first direction). In the drawing, the longitudinal length thereof is partially omitted.

The upper thin plate portion 107, or a constitutive element of a first part, includes an electron beam transmission bore 102 for the passage of the electron beam, which is formed at a location in the plate corresponding to the optical axis OA of the electron beam. A cylindrical protrusion 103 extending downward in axisymmetric relationship with respect to the optical axis OA surrounds the electron beam transmission bore 102. On the other hand, the lower thin plate portion 108, or a constitutive element of a second part, includes a predetermined opening at a location corresponding to that of the above-described protrusion 103. The diameter of this opening is larger than the outer diameter of the protrusion 103, so that a lens gap 104 is formed between the exterior wall of the protrusion 103 and the interior wall 105 of the opening. In this connection, the space between respective thin plate portions 107 and 108 and the height of the protrusion 103 are designed such that a bottom end of the protrusion 103 may be positioned above a lower surface of the lower thin plate portion 108 by a predetermined distance in the Z-axis direction.

In addition, thick plate portions 109, 111 are formed to serve as predetermined ribs in the peripheries of those thin plate portions 107, 108 for preventing the thin plate portions 107, 108 from bending in the X-axis direction (the first direction defined by the longitudinal axis direction). A coil 110 for supplying a current around a plurality of optical axes OA along the direction orthogonal to the optical axes OA is disposed between the thick plate portions 109 and 111. Reference numeral 120 in the drawing designates a position of a screw for securing an upper magnetic pole with a lower magnetic pole.

Further, an O-ring retainer member 113 made of a nonmagnetic metal part and adapted for retaining an O-ring 114 is disposed between the respective upper and lower thin plate portions 107 and 108. This O-ring retainer member 113 may be cylindrical or annular shaped with grooves formed in its upper and lower ends. The O-ring is inserted in those grooves and thus clamped between respective thin plate portions 107 and 108. Owing to this configuration, the optical axis OA side and the coil 110 side can be sealingly separated from each other, so that the optical axis OA side can be maintained in the vacuum condition, while at the same time the coil 110, and substantially the entire pole surface, can be left in the atmosphere.

A thin plate 106 is disposed in the bottom end of the objective lens 101 facing to a sample 112. This thin plate 106 is to be applied with a positive voltage so that the aberration of the primary electrons may be reduced considerably, while at the same time the acceleration of the secondary electrons emanating from the sample 112 may be facilitated.

In this regard, a plurality of electron beams is incident to the objective lens 101, and spacing between optical axes OA is determined in dependence on the spacing of the electron guns. Assuming that the spacing of the electron guns is 25 mm, the spacing between the optical axes OA when projected in the X-axis direction is $25/\sqrt{2}=17.7$ mm. This may be the case where the position of the optical axes has been set such that a triangle formed by an oblique line represented by the line, S, connecting two optical axes to each other and lines representing the axial center distances of the optical axes, Lx and Ly, in the directions parallel to the X-axis and Y-axis, respectively, defines an isosceles right triangle, as shown in FIG. 5.

Making a calculation based on the value 17.7 mm of the spacing between the optical axes OA when projected on the X-axis, if applied to the wafer having a diameter of 300 mm, the result should be 300/17.7=16.97, indicating that sixteen electron beams can be positioned along the X-axis direction. In this connection, to give a simple calculation for the scanning with the sixteen electron beams, there should be as much as 16 times higher throughput as compared to the scanning with only a single electron beam. However, in a case that the sample is a circular wafer, in which the evaluation areas in opposite ends in the X-axis direction are smaller than that in the central portion, the time usable for the evaluation of those ends is shorter as compared to that usable in the central portion even in the use of the single electron beam. Considering the scanning with the sixteen electron beams by taking the foregoing into account, the improvement in the evaluation rate would be about ten times higher than the case with the single electron beam. Further, if a plurality of optical systems is provided in the X-axis direction, a long distance movement of the stage along the X-axis direction would be no longer necessary, and thus the size in the X-axis direction of a sample housing chamber for housing the sample can be reduced.

The secondary electrons emanating from the sample 112 are accelerated by the positive electric field generated by the thin plate 106, converged by the Z-axial magnetic field generated by the objective lens 101, deflected by an E×B separator (omitted in the drawing) disposed above the objective lens 101 toward a secondary optical system provided at a location distant with respect to the thick plate portion 109, as indicated by reference numeral 115, and then detected by a secondary electron detector (omitted in the drawing). It is to be understood from the fact that the distances between respective optical axes OA when projected on the X-axis are all equal, that for the evaluation carried out by moving the sample table continuously in the Y-axis direction, the problem that the same evaluation area would be evaluated twice with the electron beams of different optical axes can be solved. This application may employ a separator comprising only the electromagnetic deflector instead of the E×B separator.

Figure 6:
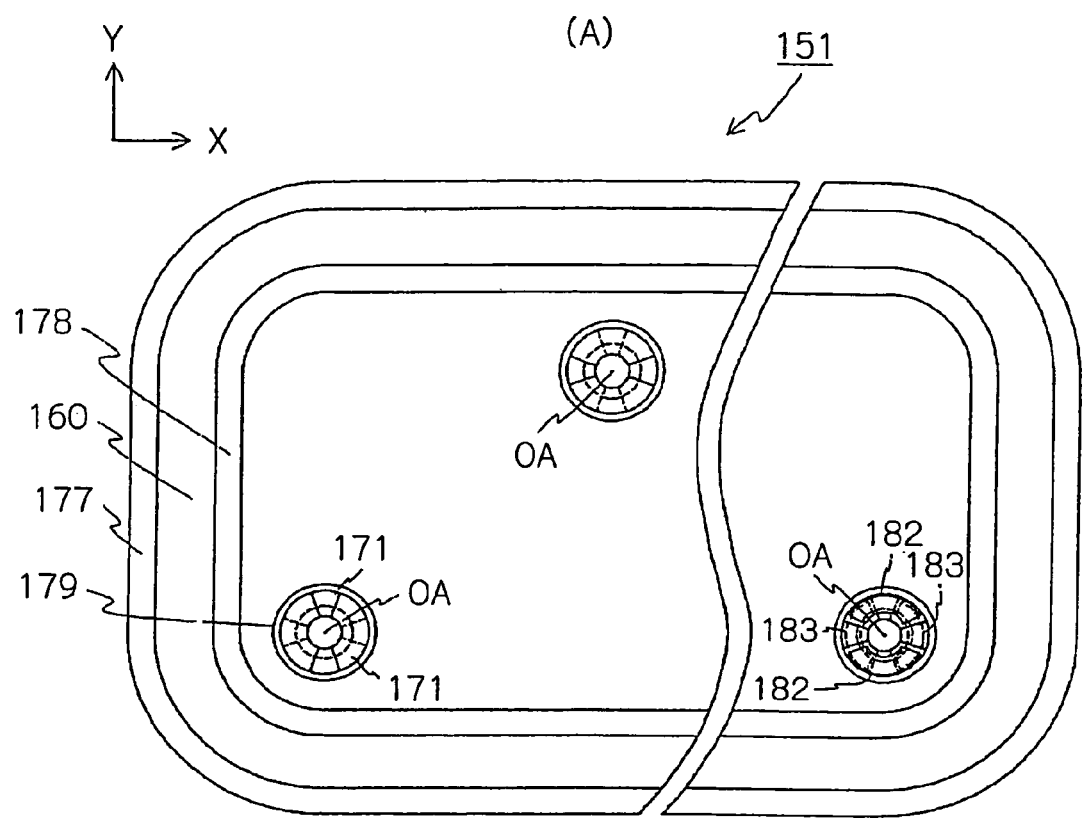
Figure 6:
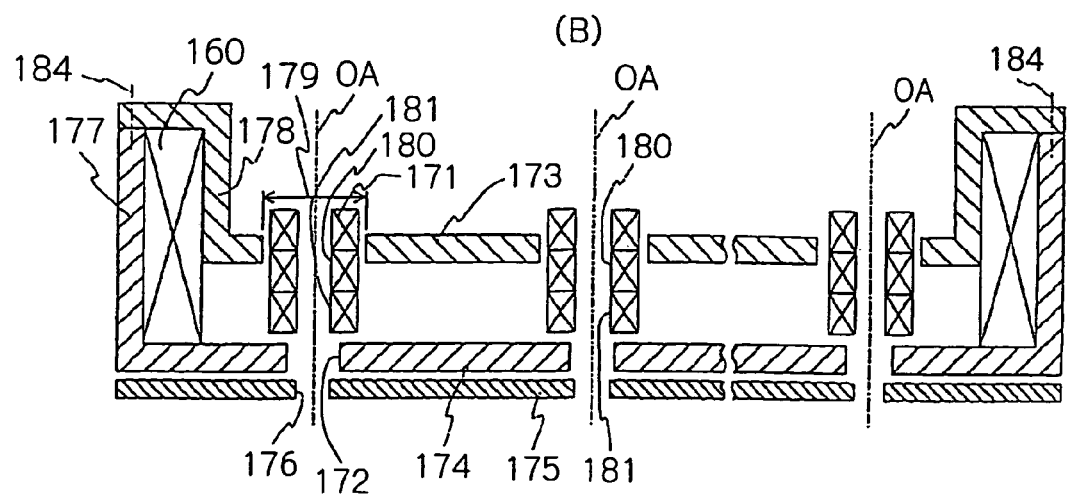

FIG. 6 is a variation of the objective lens 101 discussed in the third embodiment. The objective lens 151 in this variation is composed of: a multi-optical axis lens comprising thin plate portions 173, 174 made of ferromagnetic material (supermalloy, permalloy, μ-metal, low-hysteresis material such as electromagnetic soft iron), thick plate portions 177, 178 and a coil 160 disposed between the thick plate portion 177 and the thick plate portion 178; a group of deflectors 171, 180, 181; and a lens focal length correcting electrode 175. In order to reduce the deflection aberration of the electron beam, the group of deflectors 171, 180, 181 has a three-step structure so that the deflection can be achieved in large area without increasing the aberration by applying the optimal control of the deflection amounts and relative rotational angles to those deflectors through a simulation.

Further, in the objective lens 151, uneven focal distances could be produced among optical axes OA depending on the processing accuracy of the aperture 179 or 172 of the objective lens 151, and in order to correct the unevenness, the lens focal length correcting electrode 175 is made of ceramic material, allowing for each independent voltage to be applied for each optical axis OA. The deflection coil 171, 181 has a saddle-type coil wound over an angular extent of 120° or an X-axial deflection coil 182 and a Y-axial deflection coil 183, respectively. Reference numeral 184 in the drawing designates a position of a screw for securing an upper magnetic pole with a lower magnetic pole.

Figure 7:
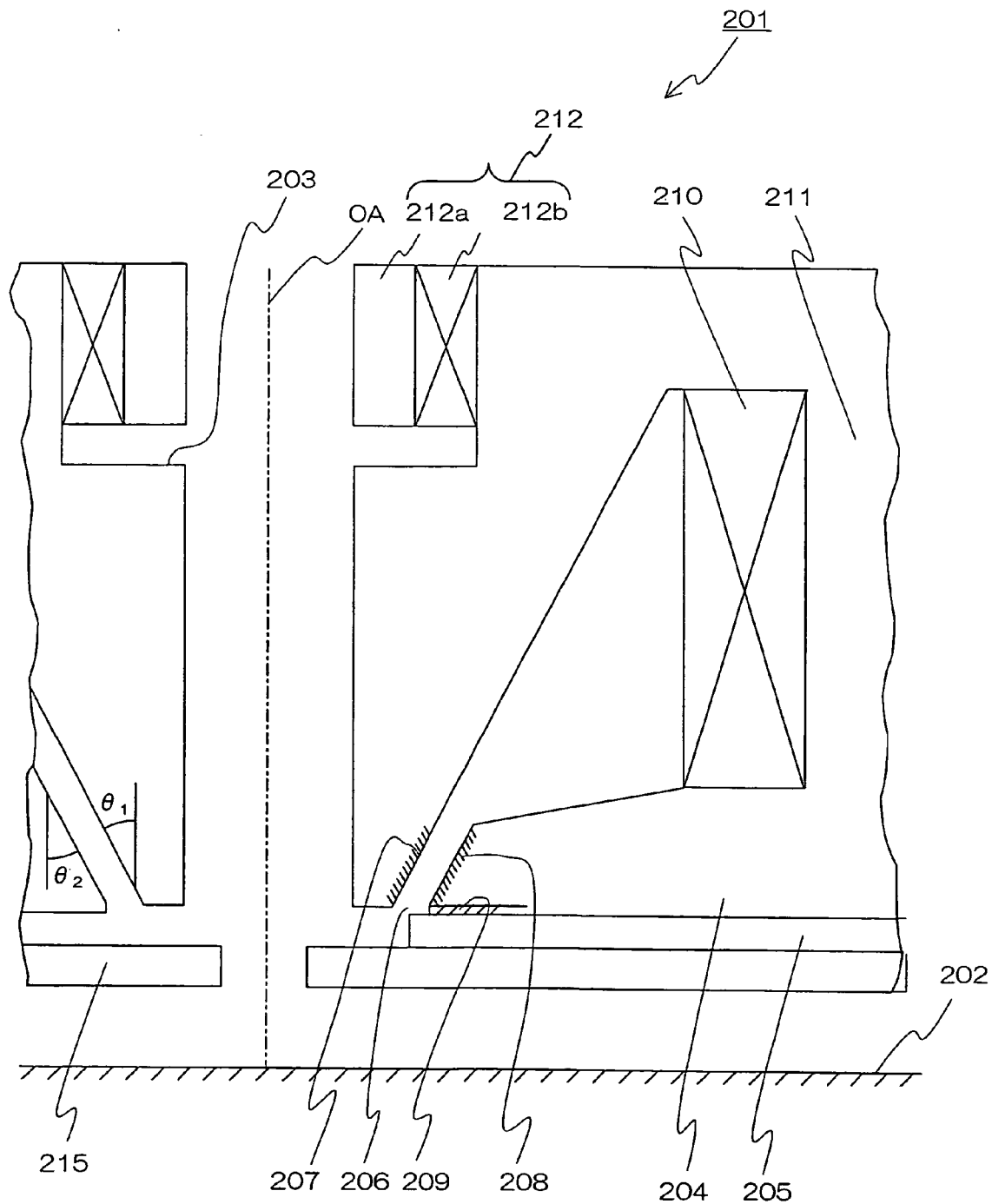
FIG. 7 is a sectional view of an objective lens according to a fourth embodiment of the present invention.

A fourth embodiment of the present invention will now be described with reference to FIG. 7. FIG. 7 shows an objective lens 201 of the fourth embodiment in a sectional view, illustrating the objective lens 201 cut in a section including the optical axis OA. An electron gun is installed, though not shown, above the component shown in the drawing, and the system is designed such that an electron beam emitted from said electron gun is transmitted along an optical axis through an aperture in the objective lens 201 to be focused thereby onto a surface of a sample 202. This objective lens 201 has been formed into a configuration in which an exciting coil 201 is surrounded with an inner magnetic pole 203, an outer magnetic pole 204 and a magnetic circuit 211, and a lens gap 206 is open to the sample 202.

In this illustrated objective lens 201, differently from the conventional objective lens, a section geometry of the lens gap 206 is not in parallel with the optical axis OA, but defines a shape representing a side wall of truncated cone with a smaller radius in the sample 202 side and a larger radius in the electron gun side. It has been confirmed through a simulation that the configuration with such a geometry as that of the side wall of the truncated cone can reduce the number of ATs (ampere-turns) of the exciting current required for obtaining the focal condition to one-half of that with the lens gap oriented in parallel with the optical axis.

The prior art also has a problem that the density of magnetic flux passing through each magnetic pole tends to be too high in the regions where an inner and an outer magnetic pole 203, 204, respectively, are facing each other (the regions of hatching in the drawing), approaching the saturation magnetic flux density, and this problem has been solved as follows:

A region of hatching 207 of the inner magnetic pole 203 has higher flux density in the electron gun side, while a region of hatching 208 of the outer magnetic pole 204 has higher flux density in the sample 202 side. Since the region of hatching 207 of the inner magnetic pole 203 has a larger section area in the electron gun side when cut by a plane orthogonal to the optical axis, the above-described problem of saturation can be solved.

At the same time, in the region of hatching 208 of the outer magnetic pole 204, the problem of saturation of magnetic flux can be avoided by an increase in the thickness by a small amount, as indicated by a region of hatching 209. It has been proved through a simulation that consequently, the electron beam can be focused narrower even in a case of the application of high voltage to an electrode 215. Further, the values indicative of one-half of the vertex angle of the cone, $\theta_1$ and $\theta_2$, are values corresponding to the inner magnetic pole and the outer magnetic pole, respectively, wherein in case of both the $\theta_1$ and $\theta_2$ being greater than 45°, the magnetic flux density of the magnetic pole is low and so such a material of low saturation magnetic flux density as supermalloy has been usable.

Further, a spacer 205 for securing the electrode 215 to the bottom surface of the magnetic pole comprising the outer magnetic pole 204 is disposed below the outer magnetic pole 204, and a ceramic material such as SiC that is conductive in some degree has been employed as the material of the spacer 205; thereby the problem of charge-up which could occur when the electron beam reach the surface of the insulating material through a straight path without any obstacle has been successfully solved.

Further, the objective lens 201 comprises an E×B separator 212 for deflecting the secondary electrons emanating from the sample 202 toward a detector (omitted in the drawing), which is provided in the form of a saddle-shaped coil with an electromagnetic deflector 212b attached externally to an electrostatic deflector 212a, wherein a core of the magnetic material in the outer side is in common with the inner magnetic pole 203 of the objective lens 201, to thereby minimize the axial misalignment between the objective lens 201 and respective deflectors 212a, 212b. It has been confirmed that when permendur (Co—Fe 50% alloy) is used in a region around the lens gap 206 and permalloy B (Fe—Ni (45%) alloy) is used in the other parts of the magnetic circuit, a required level of magnetic field can be formed even for the higher energy of the electron beam.

Figure 8:
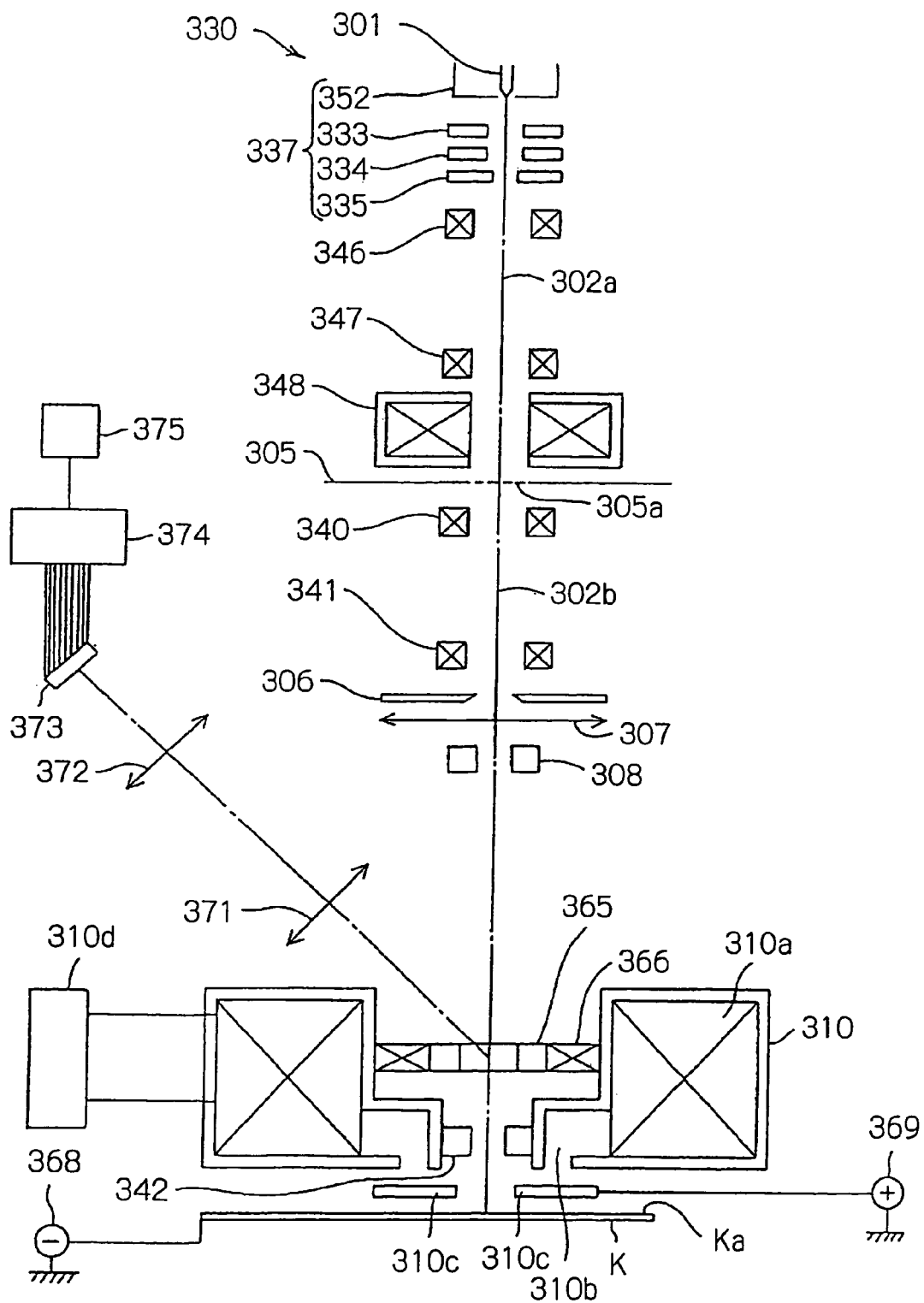
FIG. 8 is a schematic diagram illustrating a general configuration of an electron optical apparatus used in a method for evaluating a pattern according to a fifth embodiment of the present invention.

FIG. 8 is a schematic diagram illustrating a general configuration of an electron optical apparatus 330 used in a method for evaluating a pattern according to a fifth embodiment of the present invention. The electron beam apparatus 330 includes an electron gun 337 comprising a cathode 301, a Wehnelt 352, a first anode 333, a second anode 334 and a third anode 335. Since the electron gun 337 is operable under a space charge limited condition, shot noise can be reduced to ¼ or lower of the volume given by the Schottky's theorem. An electron beam 302a emitted from the electron gun 337 is aligned with a condenser lens 348 and a multi-aperture 305a of a multi-aperture plate 305 by axial aligning coils 346 and 347.

The multi-beam in the matrix of four-row×four-column formed in the multi-aperture 305a is axially aligned with an NA aperture 306 and a reducing lens 307 by axial aligning coils 340 and 341. A demagnified beam 302b that has been demanified approximately by 1/10 in the reducing lens 307 is axially aligned with an objective lens 310 by octopole electrostatic deflectors 308 and 342 so as to make the multi-beam 302b focused on a sample, K. The objective lens 310 is composed of an electromagnetic lens 310a and an axisymmetric electrode 310c. A gap 310b of the electromagnetic lens 310a is defined in its sample side and a maximal value of the axial magnetic field is produced in the sample side of the electromagnetic lens 310a, and so the principal plane of the lens is equivalently lowered so as to reduce an aberration factor.

In the electron beam apparatus 330, the axisymmetric electrode 310c to be applied with a positive voltage is disposed in the position Z, having the maximum axial magnetic field, so as to further reduce the aberration. The multi-beam 302b is driven to make a two-dimensional scanning operation across the sample K by applying a scanning voltage to both of the axial aligning deflectors 308 and 342. Secondary electrons emanating from the sample K are accelerated in an accelerating electric field generated by a negative voltage 368 applied to the sample and the positive voltage 369 of the lens, converged to pass through the objective lens 310 in the form of narrow beam and then deflected by E×B separators 365, 366 toward the left-hand in FIG. 8, where the spacing between respective beams of the multi-beam is extended by the two-step of electrostatic lenses 371 and 372, and finally the beam is detected by a multi-detector 373 comprising a scintillator and photomultipliers. Specifically, the beam is converted to the optical signal by the scintillator, which in turn is incident on the photoelectric surface of the photomultiplier, where photoelectrons are generated, which in turn are amplified in a multi-step electrode and then converted from the current signal to the voltage signal by a resister connected between the final electrode and the ground.

A two-dimensional image is produced by a signal processing circuit 374 based on the output signal from the multi-detector 373 and the thus produced image is stored in a memory 375. The magnetic lens is associated with a problem of the beam being rotated in return for its reduced aberration. The multi-beam has a problem, for example, that if there is misalignment between the arrangement of the multi-beam and the reference coordinate axis, the distances between respective beams projected in the Y-axis direction are no longer of an even distance. In the electron beam apparatus 330, when there is excess rotation of the multi-beam after its transmission through the objective lens, the exciting current of the lens may be decreased, and if this action inversely causes under-focus in the focal condition, the voltage applied to the electrode 310c may be decreased to satisfy the focal condition. Further, if there is rotational misalignment between the rotational direction of the secondary electron image and the secondary electron detector, the lens 372 or the lens 371 may be implemented with an electromagnetic lens, which serves to compensate for the rotational misalignment.

Figure 9:
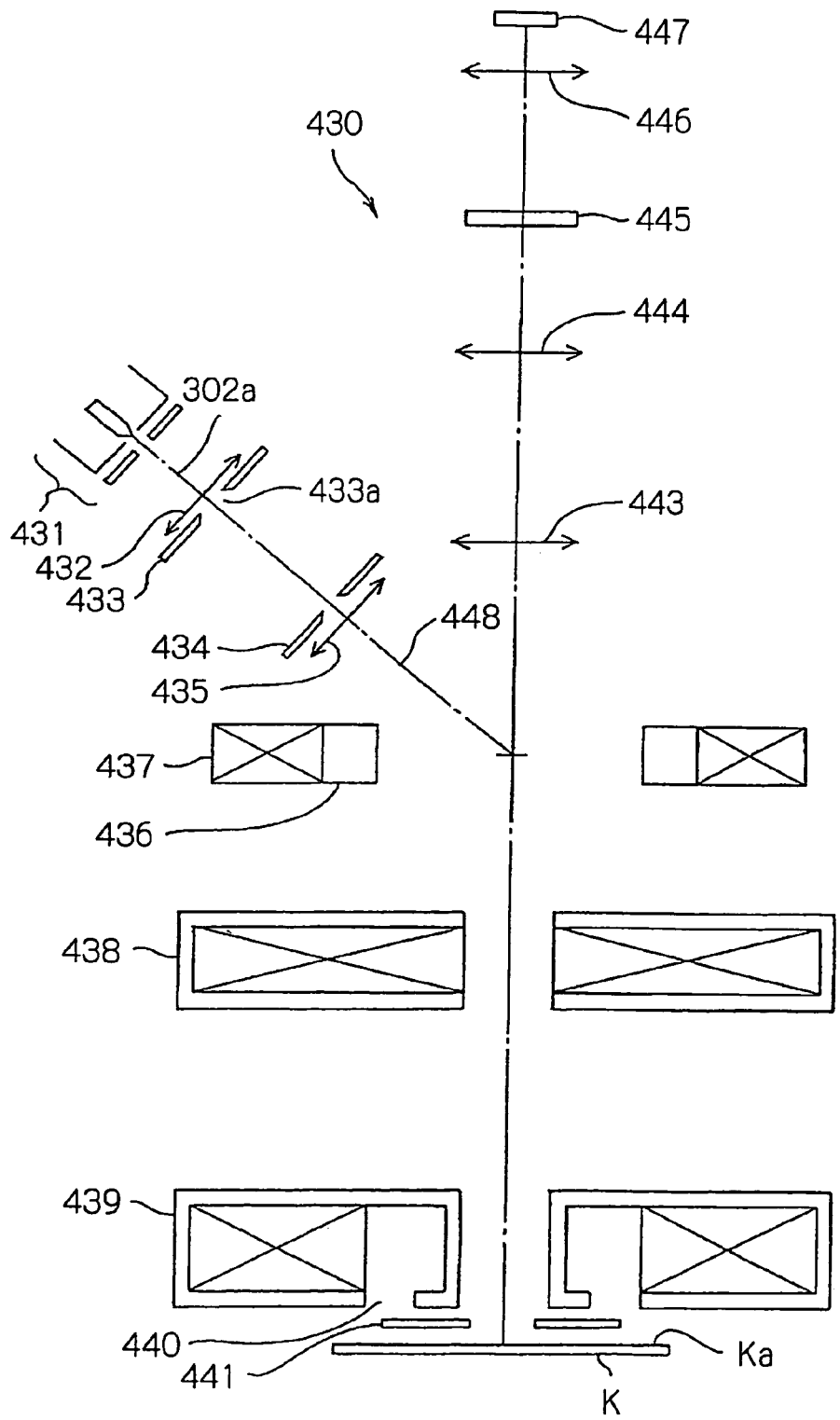
FIG. 9 is a schematic diagram illustrating a general configuration of an electron optical apparatus used in a method for evaluating a pattern according to a sixth embodiment of the present invention.

FIG. 9 is a schematic view illustrating a general configuration of an electron optical apparatus used in a method for evaluating a pattern according to a sixth embodiment of the present invention. In an electron optical apparatus 430 of the sixth embodiment, an electron beam 302a emitted from an electron gun 431 is converged by a condenser lens 432, and illuminates a rectangular aperture 433a of an aperture plate 433. The electron beam defining a rectangular shape forms a crossover in an NA aperture 434, forms a rectangular image in a conjugate plane 448 relative to the primary beam 302a to a sample surface, Ka, with the aid of an irradiation lens 435, deflected by E×B separators 436, 437 toward the sample side and then focused on a sample surface 442 as a rectangular beam by the two-stage of lenses 438, 439. Since the present electron optical apparatus places priority on a secondary beam and thus the conjugate plane for the sample surface is formed in the deflection principal plane of the E×B separators 436, 437 by the secondary beam, the conjugate plane for the sample surface by the primary beam having somewhat higher energy is formed in a location 448 distant from the E×B separators.

Although the two-stage of lenses 438, 439 is designed such that no rotation is induced with respect to the secondary electrons, it produces a certain degree of rotation with respect to the primary beam. The thus induced slight rotational misalignment can be compensated for by mechanical rotation of the shaping aperture 433.

A maximal merit from such a first objective lens of a lens system of image projection type, that is made up of a combination of the magnetic lens including a gap formed in a lower portion and the axisymmetric lens, as shown in FIG. 9, resides in that it can reduce an axial chromatic aberration factor to one half or less. That is, in a case of a system employing the electrostatic lens to achieve the resolution of 100 nm, which is limited by the axial chromatic aberration, employing the electromagnetic lens pair serving as the objective lens may possibly improve its resolution up to 50 nm or 25 nm.

Figure 10:
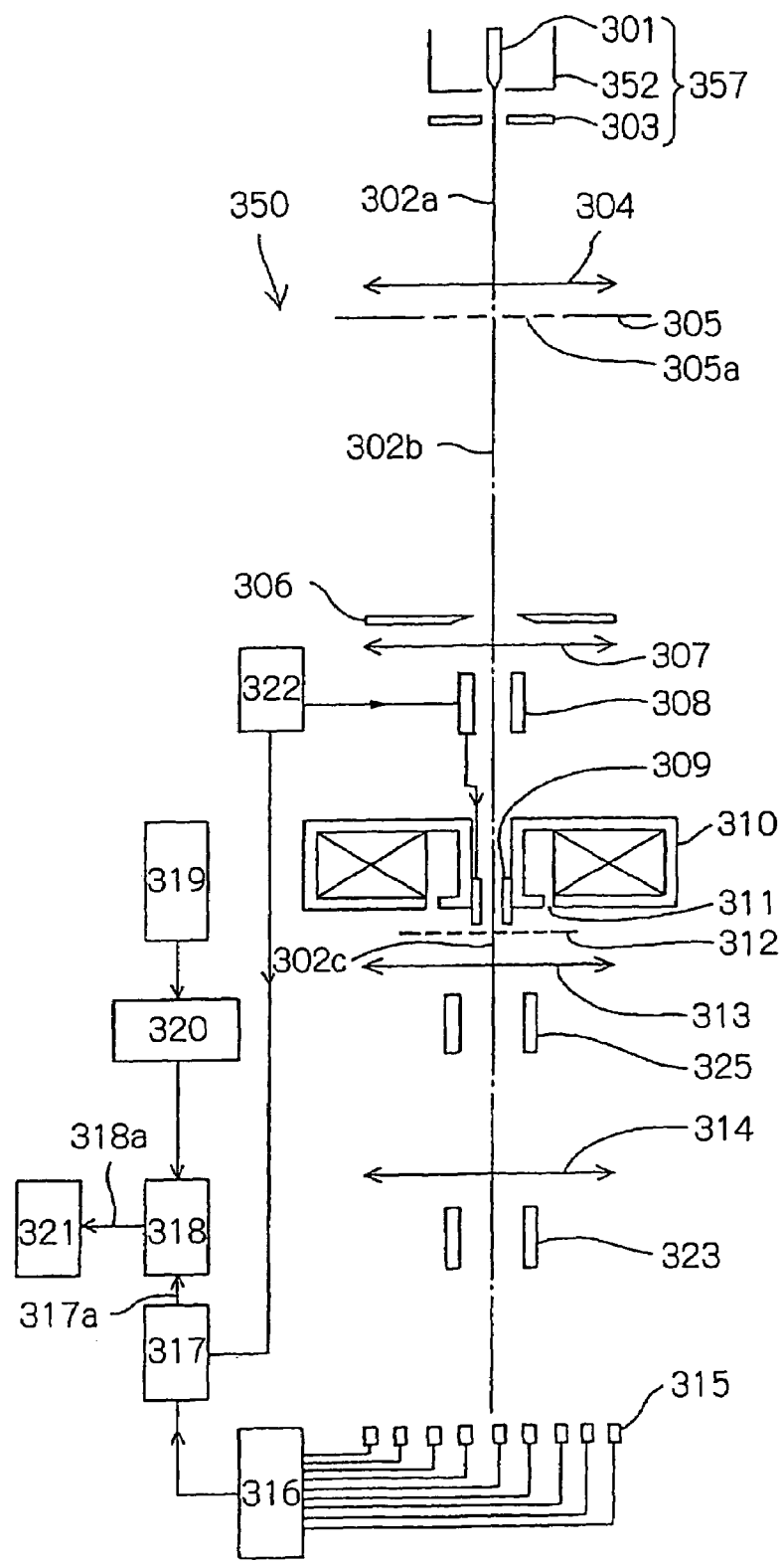
FIG. 10 is a schematic diagram illustrating a general configuration of an electron beam apparatus used in a method for inspecting a mask for defects according to the present invention.

FIG. 10 is a schematic view illustrating a general configuration of an electron beam apparatus used in a method for inspecting a mask for defects according to the present invention. The electron beam apparatus 350 includes an electron gun 357 comprising a cathode 301, a Wehnelt 352 and an anode 303. The cathode 301 is made of single crystal LaB6 that has been sharpened (ground into a circular cone having an apex angle of 90°) with a top end defining a spherical portion at the curvature radius of about 15 µm. The Wehnelt 452 is arranged at a location with its bottom wall positioned about 0.3 mm away from the tip of the cathode toward the sample side, and the brightness and emittance of the electron gun 357 may be controlled by altering a voltage applied to the Wehnelt 452. The electron gun 357 shown in FIG. 10 is used in an operational condition of higher brightness and emittance and is operable in a space charge limited region.

An electron beam 302a emitted from the electron gun 357 is converged by a condenser lens 304, and divided into a multi-beam 302b by an aperture plate 305 located below the condenser lens 304, which in turn forms a crossover in an NA aperture 306 of a primary optical system. The aperture plate 305 comprises apertures 305a in the matrix of four-rows×four-columns. The multi-beam 302b transmitted through the NA aperture 306 is reduced by a reducing lens 307 in its beam interval and beam diameter, further reduced by an objective lens 310 to the beam diameter around 50 nm to be focused on a surface of a mask (stencil mask or membrane mask) 312, and driven by deflectors 308, 309 so as to scan the mask 312.

The objective lens 310 includes its lens gap 311 defined in the sample (mask) side to lower the lens principal plane toward the sample side so that the axial chromatic aberration and the spherical aberration may be reduced. An electron beam 302c having passed through a portion of the mask 312 having no pattern is magnified by magnification lenses 313 and 314, and is focused on a detection plane where a detector 315 of four-row×four-column array is disposed.

The electron beam 302c is controlled by a deflector 325 in synchronization with the scanning over the mask surface of the mask 312 so that the electron beam 302c can pass through the center of the magnification lens 314 at any time. The transmitted electron beam is controlled by a deflector 323 to be incident to a corresponding detector 315. The mask 312 is subject to the detection while being moved continuously in the Y direction, and at the same time, the deflectors 308 and 309 apply the raster scanning to the mask in the X direction.

Figure 11:
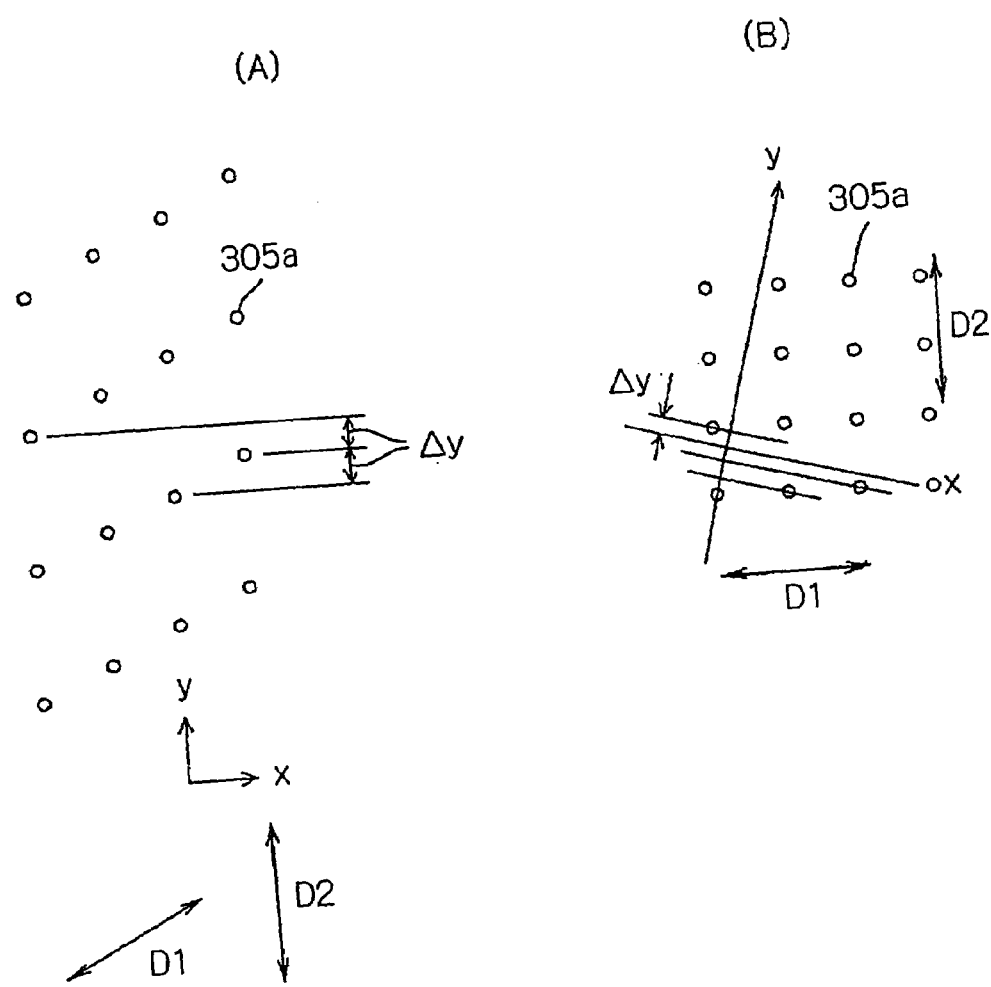
FIG. 11(A) and FIG. 11(B) are plan views, each showing multi-apertures of a multi-aperture plate usable in the electron beam apparatus of FIG. 10.

The apertures 305a of four-row×four-column array of the aperture plate 305 are arranged such that the spacing between the apertures can define an even spacing, Δy, when projected on the Y-axis, as shown in FIGS. 11A and 11B. The orientation of array of the apertures 305a is indicated by both arrows D1 and D2. A signal detected in the detector 315 is amplified and converted into digital signal in a signal processing circuit 316, which is combined with the signal from a scanning power supply 322 to form a two-dimensional image 317a in an image forming circuit 317. The two-dimensional image 317a is compared in a pattern comparison circuit 318 with the data for inspection 320, which has been converted from the pattern data 319, and a defect 318a, if any, is output to an output unit 321. Further, the apertures of four-row×four-column array may be arranged in the orthogonal orientation as shown in FIGS. 11A and 11B. In this case, the entire set of beams is rotated to have the resultant Δy all equal, as illustrated.

As for an energy of the electron beam 302b used to irradiate the mask 312, the energy in a range of 1 KeV to 20 KeV may be used in the application to the stencil mask, while the beam of relatively high energy of 10 KeV or higher may be suitable for the application to the membrane mask to avoid an extensive scattering upon transmission of the electron beam through the membrane portion.

The detector 315, if employing a scintillator characterized by a persistence time no longer than 1 nano second in combination with a PMT, can perform the scanning operation at a pixel frequency of 500 MHz. However, it is to be noted that in that case, preferably the electron gun comprising a cathode of ZrO/W or TaC rather than the cathode of LaB6 may be used, so that the electron beams emitted from the cathode in four different directions may be irradiated onto four apertures to form the multi-beam. Five apertures may be used when the electron beam emitted in the optical axis direction is utilized also, resultantly producing the multi-beam of five electron beams.

To estimate an inspection rate, the following is assumed:
Pixel size: 0.05 μm×0.05 μm,
Mask area to be inspected: 140 mm(Y)×100 mm, and
Stage flyback time: 0.5 second.

EXAMPLE 1

Sixteen beams with an electron gun comprising the LaB6 cathode,
X-directional field size: 0.05 mm,
Scanning return time: 5 μseconds,
Registration time: 10 seconds,
Sample loading/unloading time: 20 seconds, and
Clock frequency: 100 MHz.
(1) Scanning time:
$[140\times100/(0.05\times10^{-3})^2]\times10\times10^{-9}$ sec$\times[1/16]$=350 seconds
(2) Scanning flyback time:
$(140/0.05)\times[100/(16\times5\times10^{-5})]\times5\times10^{-6}{}_{sec}$=175 seconds
(3) Stage flyback time:
$(140/0.05)\times0.5$ sec=140 seconds
(4) Registration+loading/unloading time=30 seconds
Total: 695 seconds 12 minutes
Throughput: 5 masks/hour

EXAMPLE 2

Scanning with four beams at 500 MHz with an electron gun comprising the TaC cathode, with the other conditions remaining unchanged from the above Example 1.
(1) Scanning time:
$[140\times100/(0.05\times10^{-3})^2]\times2\times10^{-9}$ sec$\times[1/4]$=280 seconds
(2) Scanning flyback time:
$(140/0.5)\times[100/(4\times5\times10^{-5})]\times5\times10^{-6}$ sec=700 seconds
(3) Stage flyback time:=140 seconds
(4) Registration+loading/unloading time=30 seconds
Total: 1150 seconds=19 minutes
Throughput: 3.2 masks/hour Turning now to flow charts in FIGS. 12 and 13, a method for manufacturing a semiconductor device by using the electron beam apparatus of the present invention will be described. The electron beam apparatus of the present invention is intended to provide evaluation of wafers during processing or after being processed in the flow charts shown in FIGS. 12 and 13.

Figure 12:
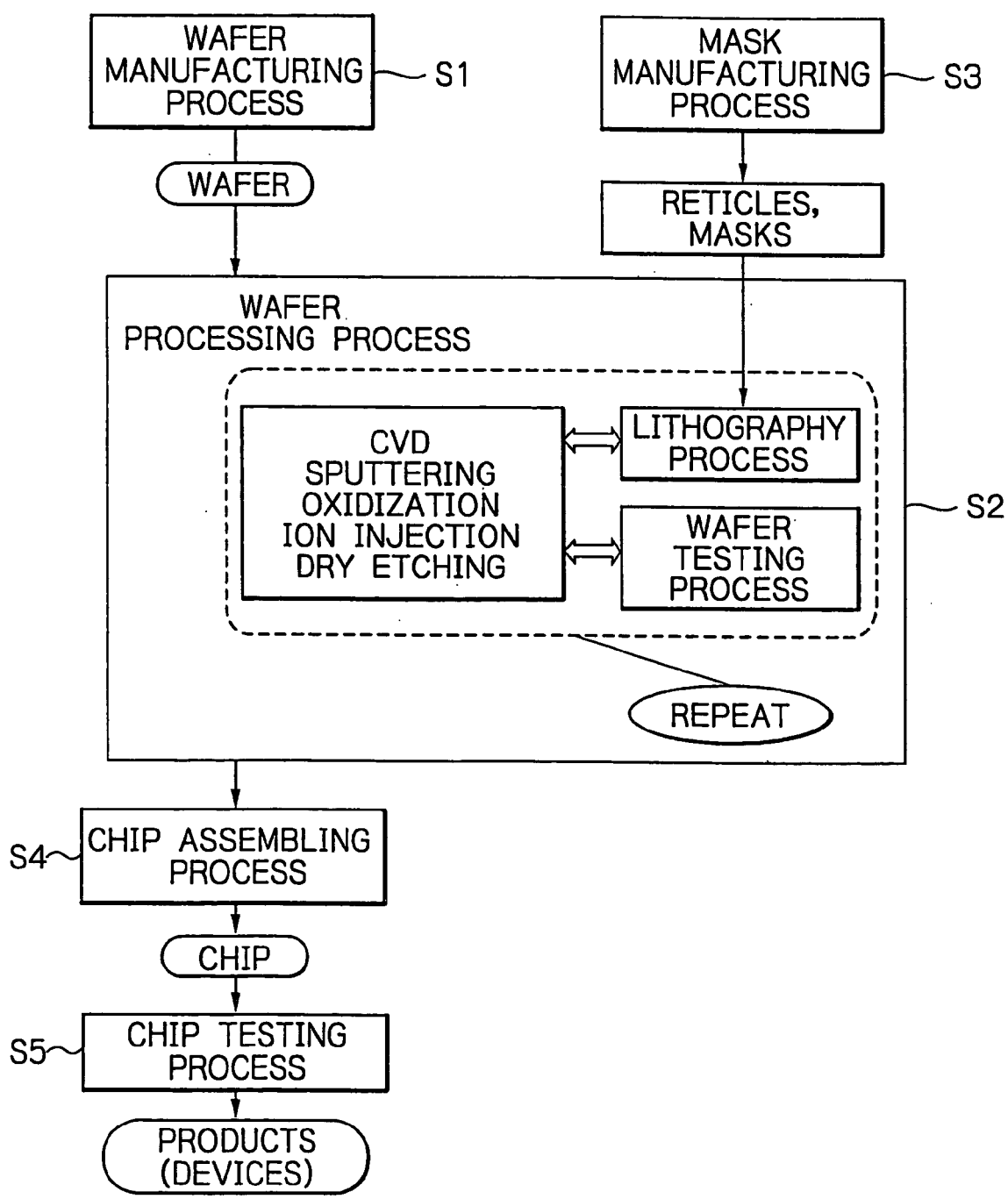
FIG. 12 is a flow chart of a method for manufacturing a semiconductor device by using an electron beam apparatus of the present invention.

As shown in FIG. 12, the method for manufacturing a semiconductor device, if divided schematically, includes: a wafer fabricating process S1 for fabricating a wafer; a wafer processing process S2 for performing any processing treatments necessary for the wafer; a mask fabricating process S3 for fabricating a mask to be used in the exposure; a chip assembling process S4 for cutting out the chips formed on the wafer one by one to make them operative; and a chip inspection process S5 for inspecting an assembled chip. Those processes include some sub-processes, respectively.

Among those processes, one that has a critical effect on the performance of the semiconductor device is the wafer processing process S2. This is based on the fact that in the wafer processing process, the designed circuit patterns are formed on the wafer to provide many chips, which will function as memories or MPUs. As is understood, it is important to evaluate the processed condition of the wafer treated in the respective sub-processes in the wafer processing process, which is highly effective in the manufacturing of the semiconductor devices, and said sub-processes will be described below in detail.

Firstly, a dielectric thin film to be used as an insulation layer is deposited, while a metallic thin film to be formed into a wiring section or an electrode section is deposited. This thin film deposition may be accomplished by CVD or sputtering. Secondly, the thus formed dielectric thin film and metallic thin film as well as the wafer substrate are oxidized, while on the other hand, the mask or reticle fabricated in the mask fabricating process S3 is used in the lithography process, where a resist pattern is formed thereon. Subsequently, by means of a dry etching technique, for example, the substrate is processed in conformity to the resist pattern, which is further implanted with ions and impurities. Then, the resist layer is stripped off and the wafer is subjected to inspection. The wafer processing process as described above must be performed repeatedly as required depending on the number of layers contained in the wafer, thus to manufacture the wafer as it is before cutting it into separate chips in the chip assembling process S4.

Figure 13:
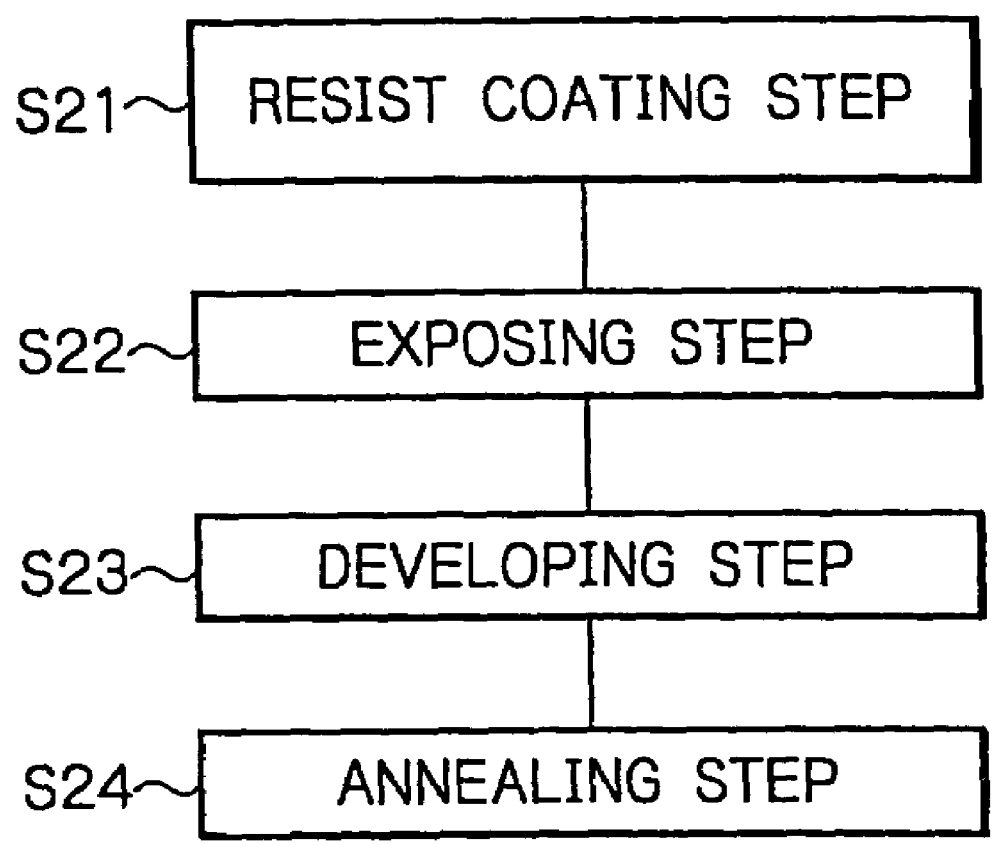
FIG. 13 is a flow chart illustrating a lithography process representing a sub-process of the wafer processing process shown in FIG. 12.

FIG. 13 is a flow chart illustrating the lithography process; one of the sub-processes included in the wafer processing process of FIG. 12. As shown in FIG. 13, the lithography process comprises a resist coating process S21, an exposing process S22, a developing process S23 and an annealing process S24. In the resist coating process S21, the wafer having a circuit pattern formed thereon in the preceding stage is coated with the resist, and then in the exposing process S22, the coated resist is exposed. Subsequently, in the developing process S23, the exposed resist is developed to obtain the resist pattern, and then in the annealing process S24, the developed resist pattern is annealed and thus stabilized. All of the above process S21 to S24 may be performed repeatedly as necessary depending on the number of layers required.

What is claimed is:

1. An objective lens comprising:
    an upper part comprising an upper thin plate portion made of ferromagnetic material and having its longitudinal axis in an X-axis direction and a first thick plate portion in a rib structure surrounding circumferentially said upper thin plate portion, said upper thin plate portion including a plurality of tubular protrusions at locations corresponding to optical axes of electron beams;
    a lower part comprising a lower thin plate portion made of ferromagnetic material and having its longitudinal axis in the X-axis direction and a second thick plate portion in a rib structure surrounding circumferentially said lower thin plate portion, said second thin plate portion including a plurality of apertures at locations corresponding to the optical axes of said electron beams; and a coil disposed in a space formed between respective thick plate portions of said upper and lower parts when said upper and lower parts are combined together with their portions corresponding to respective optical axes configured in common and with a predetermined gap formed therebetween, said coil wound in the direction orthogonal to said respective optical axes.

2. An objective lens according to claim 1, wherein a relationship of a distance between said first and second thin plate portions of said upper and lower parts with a length of said tubular protrusions along the optical axes is designed such that a lens gap, through which a magnetic flux generated when the current is applied to said coil exits to the outside of said ferromagnetic material, may be formed toward the sample side.

3. An objective lens according to claim 1, wherein said objective lens is used for driving the electron beam to perform a scanning operation in a first direction while continuously moving the sample table in a second direction orthogonal to said first direction thereby to accomplish a pattern evaluation or a pattern drawing of a sample.

4. An objective lens according to claim 1, further comprising a lens focal length correcting electrode for correcting focal distances of each optical axis, said lens focal length correcting electrode is applied voltages for each optical axis of said electron beams, respectively.

* * * * *